(12) United States Patent
Miyamoto et al.

(10) Patent No.: US 10,461,159 B2
(45) Date of Patent: Oct. 29, 2019

(54) METHOD OF MANUFACTURING SEMICONDUCTOR DEVICE AND THE SEMICONDUCTOR DEVICE

(71) Applicant: Renesas Electronics Corporation, Tokyo (JP)

(72) Inventors: Hironobu Miyamoto, Ibaraki (JP); Tatsuo Nakayawa, Ibaraki (JP); Yasuhiro Okamoto, Ibaraki (JP); Atsushi Tsuboi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/966,773

(22) Filed: Apr. 30, 2018

(65) Prior Publication Data

US 2018/0342589 A1    Nov. 29, 2018

(30) Foreign Application Priority Data

May 26, 2017  (JP) .................................. 2017-104177

(51) Int. Cl.

| H01L 21/00 | (2006.01) |
| H01L 29/20 | (2006.01) |
| H01L 21/02 | (2006.01) |
| H01L 29/423 | (2006.01) |
| H01L 29/08 | (2006.01) |
| H01L 29/43 | (2006.01) |
| H01L 29/51 | (2006.01) |
| H01L 29/66 | (2006.01) |

(Continued)

(52) U.S. Cl.
CPC ...... *H01L 29/2003* (2013.01); *H01L 21/0262* (2013.01); *H01L 29/0847* (2013.01); *H01L 29/4232* (2013.01); *H01L 29/42376* (2013.01); *H01L 29/432* (2013.01); *H01L 29/513* (2013.01); *H01L 29/66462* (2013.01); *H01L 29/7783* (2013.01); *H01L 29/402* (2013.01); *H01L 29/4236* (2013.01)

(58) Field of Classification Search
CPC ............. H01L 21/0262; H01L 29/0847; H01L 29/4322; H01L 29/2003; H01L 29/42376
See application file for complete search history.

(56) References Cited

U.S. PATENT DOCUMENTS 10,243,070 B2 *  3/2019  Miyamoto  .......... H01L 21/0254

FOREIGN PATENT DOCUMENTS

WO    2010/064706 A1    6/2010

* cited by examiner

*Primary Examiner* — Samuel A Gebremariam
(74) *Attorney, Agent, or Firm* — McDermott Will & Emery LLP

(57) ABSTRACT

Characteristics of a semiconductor device using a nitride semiconductor are improved. A semiconductor device of the present invention includes a buffer layer, a channel layer, a barrier layer, a mesa-type 2DEG dissolving layer, a source electrode, a drain electrode, a gate insulating film formed on the mesa-type 2DEG dissolving layer, and an overlying gate electrode. The gate insulating film of the semiconductor device includes a sputtered film formed on the mesa-type 2DEG dissolving layer and a CVD film formed on the sputtered film. The sputtered film is formed in a non-oxidizing atmosphere by a sputtering process using a target including an insulator. This makes it possible to reduce positive charge amount at a MOS interface and in gate insulating film and increase a threshold voltage, and thus improve normally-off characteristics.

14 Claims, 18 Drawing Sheets

(51) Int. Cl.
*H01L 29/778* (2006.01)
*H01L 29/40* (2006.01)

METHOD OF MANUFACTURING SEMICONDUCTOR DEVICE AND THE SEMICONDUCTOR DEVICE

CROSS-REFERENCE TO RELATED APPLICATIONS

The disclosure of Japanese Patent Application No. 2017-104177 filed on May 26, 2017 including the specification, drawings and abstract is incorporated herein by reference in its entirety.

BACKGROUND

The present invention relates to a method of manufacturing a semiconductor device and the semiconductor device. Specifically, the invention can be preferably applied to a semiconductor device using a nitride semiconductor.

GaN-based nitride semiconductor is expected to be applied to transistors for high withstand voltage, high output, and high frequency purposes due to its wide bandgap and high electron mobility compared with Si and GaAs, and has been actively developed in recent years. Among such transistors, a transistor having normally-off characteristics is particularly useful, and thus a structure of a transistor has been investigated to allow the transistor to have the normally-off characteristics.

For example, International Publication WO 2110/064706 discloses a MIS field effect transistor using a group III nitride semiconductor layer, which is turned on at a practical positive gate voltage and can operate at high speed.

SUMMARY

The inventors are engaged in research and development of a semiconductor device using nitride semiconductor, and are keenly investigating improvement in characteristics of the semiconductor device. The inventors specifically investigate a structure of a transistor to allow the transistor to have the normally-off characteristics, for example, investigate a mesa-type structure and a recess gate structure.

Through the investigation of the inventors, however, it has been found that when thickness of a gate insulating film is increased in a transistor having a mesa-type MOS structure, a threshold potential is reduced, and thus the transistor is prevented from having the normally-off characteristics.

It is desired to solve such a problem and develop a semiconductor device having good normally-off characteristics.

Other objects and novel features will be clarified from the description of this specification and the accompanying drawings.

Typical embodiments disclosed in the present application is briefly summarized as follows.

A method of manufacturing a semiconductor device of one embodiment disclosed in the present application includes a "step of forming a gate insulating film", where the step further includes the steps of forming a first film including a first insulator on a mesa-type nitride semiconductor layer by a sputtering process using a target including the first insulator, and forming a second film including a second insulator on the first film by a CVD process.

A semiconductor device of one embodiment disclosed in the present application includes a "gate insulating film", where the gate insulating film includes a first film and a second film formed on the first film, and the first film includes a sputtered film and the second film includes a CVD film.

According to the method of manufacturing the semiconductor device of a following typical embodiment disclosed in the present application, a semiconductor device having good characteristics can be manufactured.

According to the semiconductor device of a following typical embodiment disclosed in the present application, characteristics of the semiconductor device can be improved.

DETAILED DESCRIPTION

Figure 1:
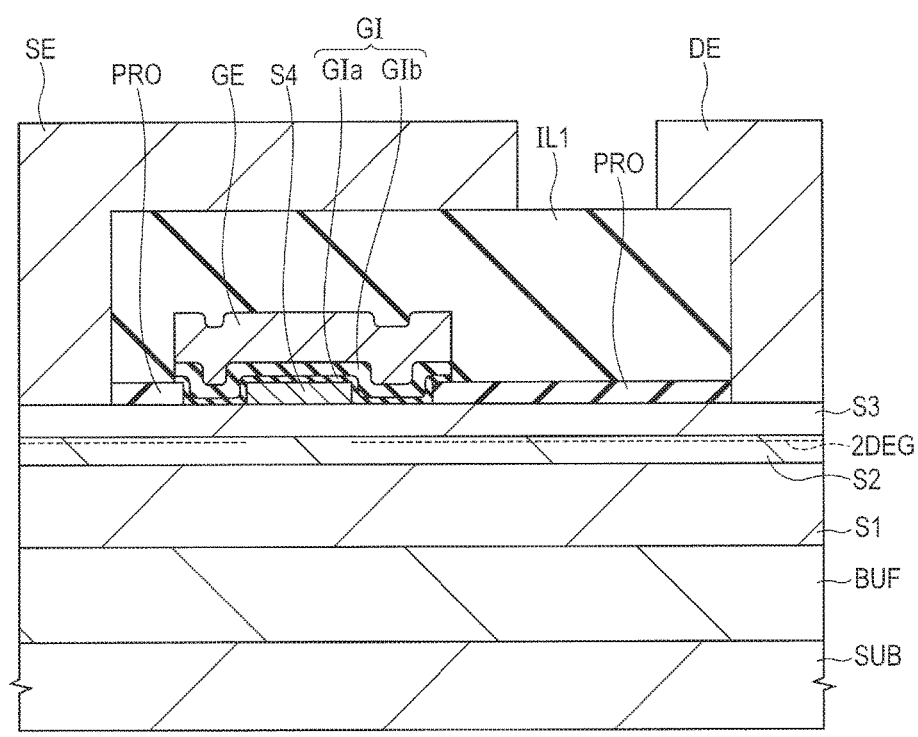
FIG. 1 is a sectional view illustrating a configuration of a semiconductor device of a first embodiment.

Although each of the following embodiments may be dividedly described in a plurality of sections or embodiments for convenience as necessary, they are not unrelated to one another except for the particularly defined case, and are in a relationship where one is a modification, an application example, detailed explanation, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the specified number. In other words, the number may be not less than or not more than the specified number.

Furthermore, in each of the following embodiments, a component (including an element step etc.) of the embodiment is not necessarily indispensable except for the particularly defined case and for the case where the component is considered to be indispensable in principle. Similarly, in the following embodiments, when a shape or a positional relationship of a component or the like is described, any configuration substantially closely related to or similar to such a shape or the like should be included except for the particularly defined case and for the case where such a configuration is considered to be not included in principle.

The same holds true in the number of elements and the like (including the number, a numerical value, amount, and a range).

Hereinafter, some embodiments will be described in detail with reference to the accompanying drawings.

In all drawings for explaining the embodiments, components having the same function are designated by the same reference numeral, and duplicated description is omitted. When a plurality of similar components (parts) exist, the numeral for a general term may be further marked with a sign to indicate an individual or a particular part. In the following embodiments, the same or similar portion is not repeatedly described in principle except for a particularly required case.

Furthermore, a sectional view for explaining each embodiment may not be hatched for better viewability.

In the sectional views, size of each part does not correspond to size of that of an actual device, and a particular site may be illustrated to be relatively large for better viewability.

First Embodiment

A structure of a semiconductor device of a first embodiment is now described with reference to the drawings.

Description of Structure

FIG. 1 is a sectional view illustrating a configuration of the semiconductor device of the first embodiment. The semiconductor device shown in FIG. 1 is a metal-oxide-semiconductor field effect transistor (MOSFET, MISFET) using a nitride semiconductor. The semiconductor device may also be referred to as high electron mobility transistor (HEMT).

The semiconductor device of the first embodiment has a high-resistance buffer layer BUF on a substrate SUB. The high-resistance buffer layer BUF may be formed on a nucleation layer that is first formed on the substrate SUB.

For example, a semiconductor substrate including silicon (Si), the (111) plane of which is exposed, can be used as the substrate SUB. In addition to such a silicon substrate, a substrate including SiC, sapphire, or the like may also be used as the substrate SUB. A GaN substrate may also be used. In such a case, the nucleation layer may be omitted.

The nucleation layer includes a nitride semiconductor layer. For example, an aluminum nitride (AlN) layer can be used as the nucleation layer.

The high-resistance buffer layer BUF includes one or more nitride semiconductor layers including a nitride semiconductor doped with an impurity that forms a deep level. For example, a superlattice structure, including a plurality of nitride semiconductor layers, may be formed by repeatedly stacking a stacked film (AlN/GaN film) of a gallium nitride (GaN) layer and an aluminum nitride (AlN) layer and used as the high-resistance buffer layer BUF.

Any of the nitride semiconductor layers (III-V compound semiconductor layers) over the substrate SUB is typically formed by group III element plane growth.

A first nitride semiconductor layer S1, a second nitride semiconductor layer S2, and a third nitride semiconductor layer S3 are sequentially formed over the high-resistance buffer layer BUF. A fourth nitride semiconductor layer S4 is formed on part of the third nitride semiconductor layer S3.

The second nitride semiconductor layer S2 has an electron affinity equal to or larger than that of the first nitride semiconductor layer S1 (S1≤S2).

The third nitride semiconductor layer S3 has an electron affinity smaller than that of the first nitride semiconductor layer S1 (S1>S3).

The fourth nitride semiconductor layer S4 is a mesa-type (mesa-shaped, convex, linear) semiconductor layer, and has a roughly rectangular cross-section. A side surface of the fourth nitride semiconductor layer S4 may have a tapered shape (forward tapered shape). The fourth nitride semiconductor layer S4 has an electron affinity equal to or smaller than that of the second nitride semiconductor layer S2 (S4≤S2).

The first nitride semiconductor layer S1 may be referred to as buffer layer (back barrier layer, channel underlayer), and includes, for example, AlGaN. The second nitride semiconductor layer S2 may be referred to as channel layer, and includes, for example, InGaN. The third nitride semiconductor layer S3 may be referred to as barrier layer (electron supply layer), and includes, for example, AlGaN. However, the third nitride semiconductor layer has a higher Al composition than the first nitride semiconductor layer S1. The fourth mesa-type nitride semiconductor layer S4 is also referred to as 2DEG dissolving layer (cap layer), and includes, for example, InGaN. However, the fourth nitride semiconductor layer S4 has an In composition equal to or higher than that of the second nitride semiconductor layer S2. The second nitride semiconductor layer (channel layer) S2 and the fourth nitride semiconductor layer (2DEG dissolving layer) S4 may each be formed of GaN.

A gate electrode GE is formed over the fourth mesa-type nitride semiconductor layer (2DEG dissolving layer) S4 with a gate insulating film GI in between. The gate insulating film GI is formed so as to cover the fourth mesa-type nitride semiconductor layer (2DEG dissolving layer) S4. That is, the width (length in a gate length direction) of the gate insulating film GI is larger than the width of the fourth mesa-type nitride semiconductor layer (2DEG dissolving layer) S4. The gate electrode GE is formed on the gate insulating film GI. The width of the gate electrode GE is the same as the width of the gate insulating film GI.

Part of the third nitride semiconductor layer (barrier layer) S3 is covered with a surface protective film PRO. A source electrode SE and a drain electrode DE are provided on the third nitride semiconductor layer (barrier layer) S3 and on the two respective sides of the fourth mesa-type nitride semiconductor layer (2DEG dissolving layer) S4. For example, contact holes are formed through a stacked film of the surface protective film PRO and an interlayer insulating film IL1, and the respective source and drain electrodes SE and DE are disposed within and over the contact holes.

Two-dimensional electron gas (2DEG) is generated at the interface between the second nitride semiconductor layer (channel layer) S2 and the third nitride semiconductor layer (barrier layer) S3. Below the gate electrode GE, however, since the fourth mesa-type nitride semiconductor layer (2DEG dissolving layer) S4 is provided with the gate insulating film GI in between, generation of the 2DEG is suppressed. Hence, when a predetermined voltage (threshold voltage) is applied to the gate electrode GE, a channel is formed below the gate electrode GE, so that the transistor is turned on.

In the first embodiment, the gate insulating film GI is configured by a sputtered film GIa as a lower layer and a CVD film GIb as an upper layer. The sputtered film GIa is formed on the fourth nitride semiconductor layer (2DEG dissolving layer) S4, and the CVD film GIb is formed on the sputtered film GIa. Such a stacked film may be described as CVD film/sputtered film.

As described above, in the first embodiment, since the gate insulating film GI is configured by the CVD film/sputtered film, the positive charge amount is reduced at the MOS interface and in the insulating film, so that the threshold voltage can be increased. Consequently, the normally-off characteristics can be improved.

Properties of the CVD film/sputtered film and advantages of using the CVD film/sputtered film are now described in order.

Properties of CVD Film/Sputtered Film

The sputtered film GIa is formed by a sputtering process. Specifically, the sputtered film GIa is formed by a sputtering process under a non-oxidizing atmosphere using a target of insulator (such as oxide or nitride). In the sputtering process, a negative voltage or a high-frequency voltage is applied to a plate-like deposition material block called target under a reduced pressure and an inert gas (for example, Ar) atmosphere to cause grow discharge to ionize the inert-gas atoms, so that the gas ions are collided with the target surface at high speed. Thus, the grains of the deposition material block configuring the target are ejected and deposited on the surface of the substrate, resulting in film formation.

For example, an aluminum oxide ($Al_2O_3$) film can be used as the sputtered film GIa. The aluminum oxide ($Al_2O_3$) film can be formed by a sputtering process using a target including aluminum oxide ($Al_2O_3$) under a non-oxidizing atmosphere, for example, an atmosphere of an inert gas such as Ar or nitrogen. In addition to the aluminum oxide ($Al_2O_3$) film, an aluminum nitride (AlN) film, a silicon oxide ($SiO_2$) film, a silicon nitride (SiN) film, and the like can be used as the sputtered film GIa. Targets of such films are aluminum nitride (AlN), silicon oxide ($SiO_2$), and silicon nitride (SiN) in order.

The CVD film GIb is formed by a chemical vapor deposition (CVD) process. In the CVD process, a source gas containing a component of an object film is supplied into a processing chamber, and a film is deposited through a chemical reaction on a substrate surface or in a vapor phase.

For example, the film is formed under an oxidizing atmosphere while a source gas containing a component of an object film is supplied.

For example, an aluminum oxide ($Al_2O_3$) film can be used as the CVD film GIb. Trimethylaluminum and an oxidizer (for example, $H_2O$, $O_3$) are used as the source gases for the aluminum oxide ($Al_2O_3$) film. In addition to the aluminum oxide ($Al_2O_3$) film, an aluminum nitride (AlN) film, a silicon oxide ($SiO_2$) film, a silicon nitride (SiN) film, and the like can be used as the CVD film GIb. The source gases for the aluminum nitride (AlN) film include trimethylaluminum, ammonia ($NH_3$), and the like. The source gases for the silicon oxide ($SiO_2$) film include silane and an oxidizer (for example, $H_2O$, $O_3$). The source gases for the silicon nitride (SiN) film include silane and ammonia ($NH_3$).

In this way, the CVD film and the sputtered film differ from each other in material and in film formation method, and thus the respective films have the following characteristics.

The CVD film GIb is formed using a compound containing hydrogen (for example, trimethylaluminum, or silane) as a source gas, and thus contains hydrogen (H) in the film. On the other hand, the sputtered film GIa is formed using an insulator itself as a target, and thus has a low content (concentration) of hydrogen (H) in the film. For example, the hydrogen (H) content of the CVD film GIb is higher than the hydrogen (H) content of the sputtered film GIa. Specifically, for example, the hydrogen (H) content of the CVD film GIb is $1 \times 10^{18}/cm^3$ or more, while the hydrogen (H)

content of the sputtered film GIa is $1E17/cm^3$ or less. The hydrogen (H) content can be measured by secondary ion mass spectrometry (SIMS). It is to be noted that 1E18 means $1 \times 10^{18}$, for example.

When an organic compound such as an Al compound (for example, trimethylaluminum) is used as the source gas, carbon (C) is incorporated in the film. Consequently, the aluminum oxide ($Al_2O_3$) film and the aluminum nitride (AlN) film each contain carbon (C). The CVD film GIb has a carbon (C) content of $1E18/cm^3$ or more, while the sputtered film GIa has a carbon (C) content of $1E17/cm^3$ or less. The carbon (C) content can be measured by secondary ion mass spectrometry (SIMS).

Advantages of Using CVD Film/Sputtered Film

As described above, using the stacked film of the CVD film/sputtered film as the gate insulating film GI makes it possible to increase the threshold voltage. Such an advantage is described with reference to FIGS. 2 to 9 in contrast with first and second comparative examples. The first comparative example corresponds to a case of using a single CVD film (CVD $Al_2O_3$) as the gate insulating film GI. The second comparative example corresponds to a case of using a single sputtered film (sputtered $Al_2O_3$) as the gate insulating film GI.

Figure 2:
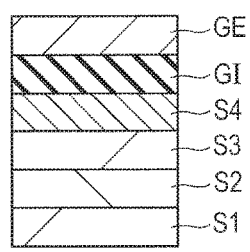
FIG. 2 illustrates a stacked state of films below a gate electrode of a semiconductor device of each of first and second comparative examples.
Figure 3:
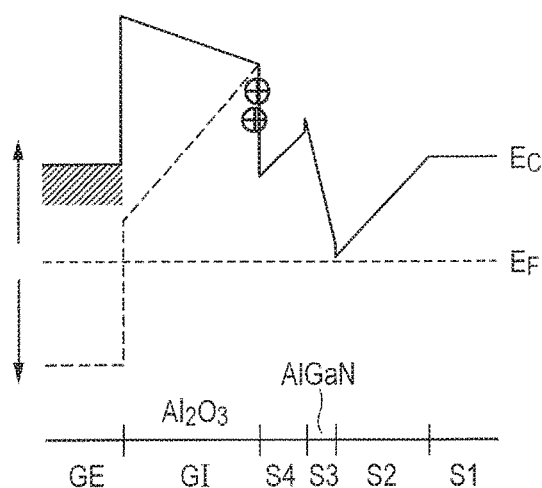
FIG. 3 illustrates an energy band below the gate electrode of the semiconductor device of the first comparative example.
Figure 4:
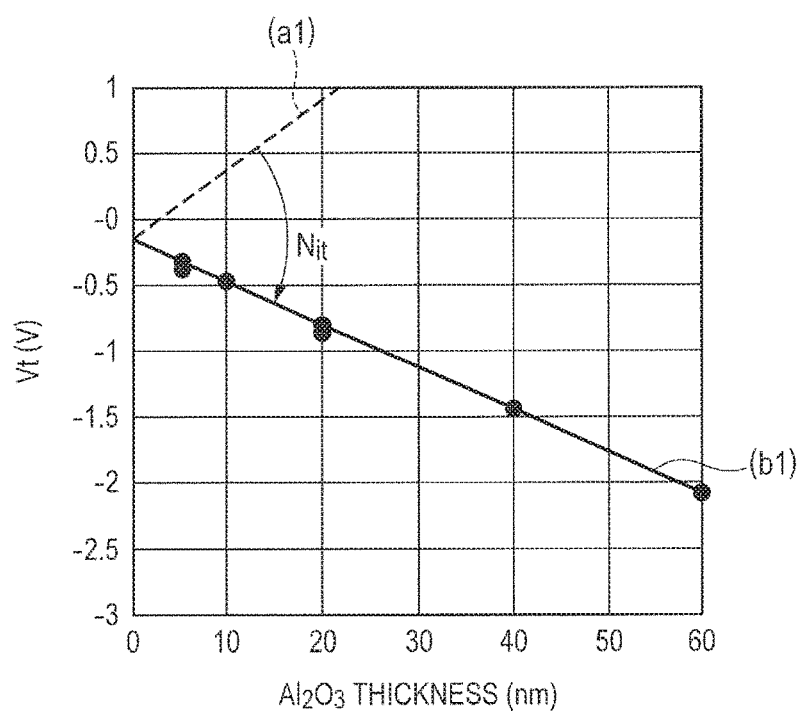
FIG. 4 is a diagram to explain a relationship between thickness of a gate insulating film and a threshold voltage of the semiconductor device of the first comparative example.
Figure 5:
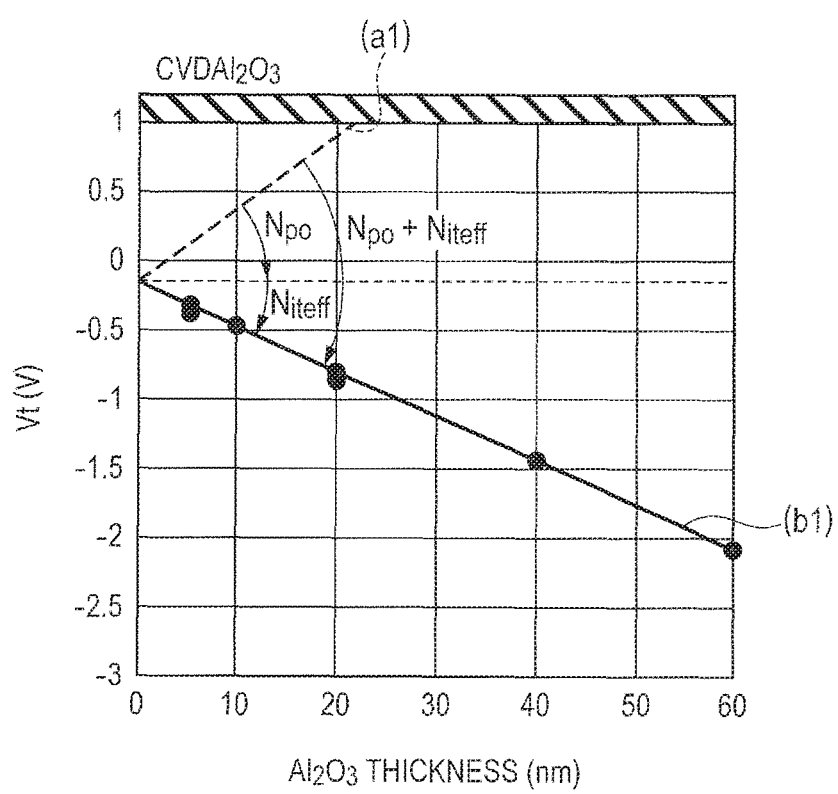
FIG. 5 is a diagram to explain a relationship between thickness of the gate insulating film and a threshold voltage of the semiconductor device of the first comparative example.
Figure 6:
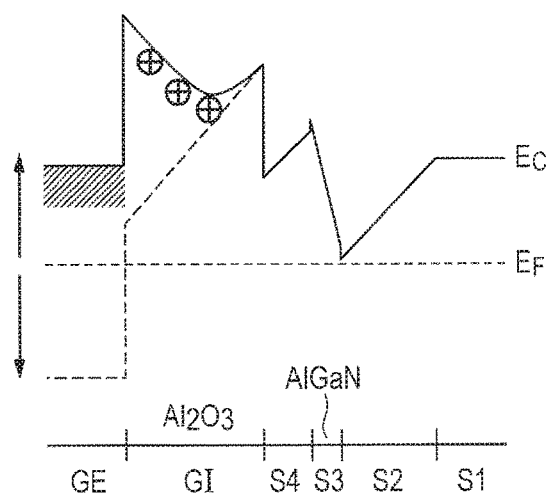
FIG. 6 illustrates an energy band below the gate electrode of the semiconductor device of the second comparative example.
Figure 7:
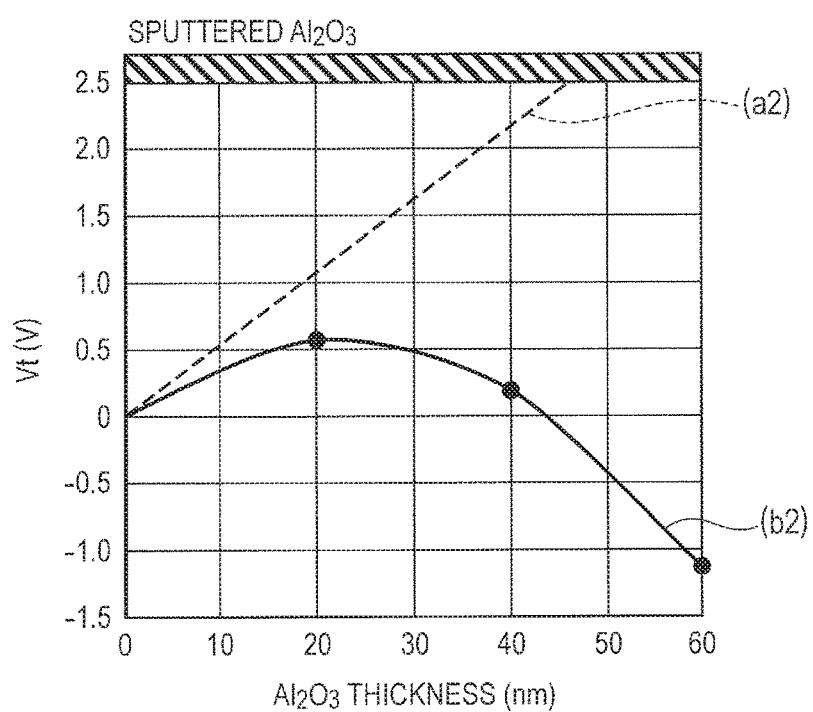
FIG. 7 is a diagram to explain a relationship between thickness of a gate insulating film and a threshold voltage of the semiconductor device of the second comparative example.
Figure 8:
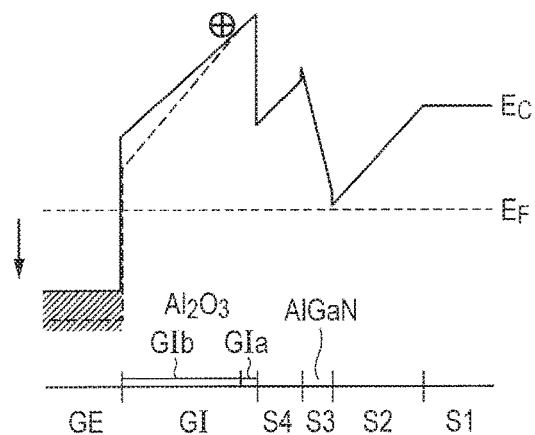
FIG. 8 illustrates an energy band below a gate electrode of the semiconductor device of the first embodiment.
Figure 9:
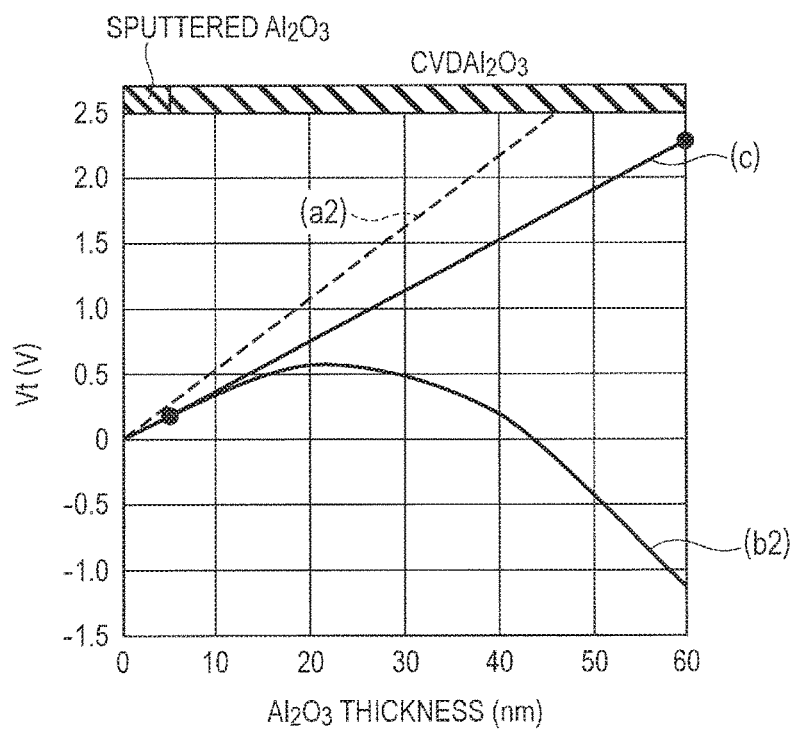
FIG. 9 is a diagram to explain a relationship between thickness of a gate insulating film and a threshold voltage of the semiconductor device of the first embodiment.

FIG. 2 illustrates a stacked state of films below a gate electrode of a semiconductor device of each of the first and second comparative examples. As shown in FIG. 2, a single-layer film is used as the gate insulating film GI in the first and second comparative examples. Other configurations are similar to those of the first embodiment (FIG. 1). FIG. 3 illustrates an energy band below the gate electrode of the semiconductor device of the first comparative example. FIGS. 4 and 5 are each a diagram to explain a relationship between thickness of the gate insulating film and a threshold voltage of the semiconductor device of the first comparative example. FIG. 6 illustrates an energy band below the gate electrode of the semiconductor device of the second comparative example. FIG. 7 is a diagram to explain a relationship between thickness of the gate insulating film and a threshold voltage of the semiconductor device of the second comparative example. FIG. 8 illustrates an energy band below the gate electrode of the semiconductor device of the first embodiment. FIG. 9 is a diagram to explain a relationship between thickness of the gate insulating film and a threshold voltage of the semiconductor device of the first embodiment. It is to be noted that "relationship between thickness of the gate insulating film and a threshold voltage" can be translated into "dependence of the threshold voltage Vt on thickness of the gate insulating film". In the relationship diagrams, the horizontal axis indicates thickness (nm), and the vertical axis indicates Vt (V). In FIGS. 4, 5, 7, and 9, broken line graphs (a1, a2) each indicate a graph for an ideal semiconductor device having no positive charge at the MOS interface or in the film. Each diagram showing the energy band is a band diagram during pinch-off.

The first comparative example, i.e., the case of using the single CVD film (CVD $Al_2O_3$) as the gate insulating film GI, is described. In the case of the first comparative example, as shown in FIG. 3, positive charge is generated at the interface (hereinafter, referred to as MOS interface) between the fourth mesa-type nitride semiconductor layer (2DEG dissolving layer) S4 and the gate insulating film (CVD film). The amount of the positive charge is 2E12 to $1E13/cm^2$.

The broken line in FIG. 3 indicates an energy band in the case of no positive charge at the MOS interface. In such a case, a high electric field is generated in the fourth mesa-type nitride semiconductor layer (2DEG dissolving layer) S4 directly below the gate electrode by negative polarization charge generated at the interface between the first nitride semiconductor layer (buffer layer) S1 and the second nitride semiconductor layer (channel layer) S2. In the ideal case of no positive charge at the MOS interface, the electric flux density of the fourth mesa-type nitride semiconductor layer (2DEG dissolving layer) S4 is transferred to the gate insulating film. Hence, the threshold voltage is shifted to a positive side by increasing the thickness of the gate insulating film.

On the other hand, when positive charge is generated at the MOS interface, the polarity of the electric flux density of the CVD $Al_2O_3$ is reversed at the MOS interface according to Gauss' law. Specifically, in the case of no positive charge at the MOS interface, the threshold voltage is located on the positive side as shown by the broken line in FIG. 3. On the other hand, the positive charge at the MOS interface shifts the threshold voltage to a negative side as shown by the solid line in FIG. 3. As a result, the threshold voltage is negative. In FIG. 3, an upward arrow indicates "threshold voltage in a negative direction", and a downward arrow indicates "threshold voltage in a positive direction" (the same holds true for FIG. 6).

As shown by graph (b1) in FIG. 4, such shift of the threshold voltage to the negative side is more significant with an increase in thickness of the gate insulating film (CVD $Al_2O_3$). For example, when the gate insulating film (CVD $Al_2O_3$) has a practical thickness for a switching transistor, 40 to 100 nm, the threshold voltage is −1 V or lower.

The second comparative example, i.e., the case of using the single sputtered film (sputtered $Al_2O_3$) as the gate insulating film GI, is described. In such a case, as shown in FIG. 6, positive charge is generated in the gate insulating film (CVD $Al_2O_3$) while being substantially zero at the MOS interface. Hence, graph (b2) in FIG. 17 becomes convex upward, and as the gate insulating film (CVD $Al_2O_3$) is increased in thickness, the threshold voltage is reduced due to the positive charge in the gate insulating film. For example, when the gate insulating film (sputtered $Al_2O_3$) has a practical thickness for a switching transistor, 40 to 100 nm, the threshold voltage is negative.

On the other hand, as in the first embodiment, when the stacked film of the CVD film/sputtered film, specifically the stacked film of the CVD $Al_2O_3$/sputtered $Al_2O_3$, is used as the gate insulating film GI, the sputtered $Al_2O_3$, which does not cause positive charge at the MOS interface, exists in the vicinity of the MOS interface, and the CVD $Al_2O_3$, which does not cause positive charge in the insulating film, exists on the sputtered $Al_2O_3$. Hence, while the positive charge at the MOS interface is reduced, the positive charge in the gate insulating film is suppressed, and thus the threshold voltage can be increased (see FIG. 8).

Specifically, since the sputtered film configuring the lower layer of the gate insulating film GI of the first embodiment is formed in a non-oxidizing atmosphere without an oxidizer, oxidization of the fourth mesa-type nitride semiconductor layer (2DEG dissolving layer) is suppressed, and thus the positive charge at the MOS interface can be reduced.

For the sputtered film, although the positive charge can be reduced at the MOS interface, positive charge may be generated in the film due to plasma damage . Hence, increasing the thickness of the sputtered film increases influence of the positive charge in the film, so that threshold voltage is reduced directly with the square of the film thickness (see graph (b2) in FIG. 7). The CVD film is therefore used as the upper layer of the gate insulating film GI. Since the CVD film does not receive the plasma damage, no positive charge is generated in the film. In addition, even if the thickness of the CVD film is increased, the charge in the film has only slight influence, so that the threshold voltage linearly varies (see graph (c) in FIG. 9).

As described above, in the first embodiment, the sputtered film causing only a slight amount of positive charge at the MOS interface is formed on the fourth mesa-type nitride semiconductor layer (2DEG dissolving layer), and the thickness of the sputtered film is made small to reduce the influence of the positive charge in the film, and the CVD film having a small amount of positive charge in the insulating film is formed up to the thickness of the gate insulating film necessary for the semiconductor device. This makes it possible to increase the threshold voltage and thus improve the normally-off characteristics.

As described above, the sputtered film is preferably as thin as possible to reduce the influence of the positive charge in the film. For example, the thickness of the sputtered film is preferably 20 nm or less, and more preferably 10 nm or less (see graph (c) in FIG. 9).

First Verification

The threshold voltages of the first and second comparative examples and the first embodiment are now described using numerical expressions.

The threshold voltage can be represented by Expression (1), and the gradient of the graph of the threshold can be represented by Expression (2) obtained by differentiating Expression (1) with thickness. The MOS interface charge ($N_{it}$) can be represented by Expression (3).

$$Vt = -0.5 \cdot (q \cdot N_{ot})/(\varepsilon_0 \cdot \varepsilon_r) \cdot t^2 - (q \cdot N_{iteff})/(\varepsilon_0 \cdot \varepsilon_r) \cdot t + \Phi_B - (\Delta E_C + E_F) + \text{2DEG dissolving layer increment} + \text{barrier layer decrement} \quad (1)$$

$$dVt/dt = (q \cdot N_{ot})/(\varepsilon_0 \cdot \varepsilon_r) \cdot t - (q \cdot N_{iteff})/(\varepsilon_0 \cdot \varepsilon_r) \quad (2)$$

$$qN_{it} = qN_{po} + qN_{iteff} \quad (3)$$

Vt: threshold voltage
q $N_{it}$=q $N_{po}$+q $N_{iteff}$: MOS interface charge
q $N_{ot}$: charge in gate insulating film
−q $N_{po}$: charge generated at interface between buffer layer and channel layer
t: thickness of insulating film
q: elementary charge
$\varepsilon_0$: dielectric constant
$\varepsilon_r$: dielectric constant of insulating film
$\Phi_B$: barrier height between gate electrode and insulating film
$\Delta E_C$: discontinuous quantity between insulating film and channel layer
$E_F$: Fermi energy The dependence of the threshold voltage Vt on the thickness of the gate insulating film is measured, and $N_{ot}$ (charge in the gate insulating film) is estimated from the secondary coefficient value A2 of t in Expression (1), and $qN_{it}=qN_{po}+qN_{iteff}$ (MOS interface charge) is estimated from the primary coefficient value A1 of t in Expression (1).

$$A2 = 0.5(q \cdot N_{ot})/(\varepsilon_0 \cdot \varepsilon_r) \quad (4)$$

$$N_{ot} = 2((\varepsilon_0 \cdot \varepsilon_r)/q) \cdot A2 \quad (5)$$

$$A1 = (q \cdot N_{iteff})/(\varepsilon_0 \cdot \varepsilon_r) \quad (6)$$

$$N_{iteff} = ((\varepsilon_0 \cdot \varepsilon_r)/q) \cdot A1 \quad (7)$$

In the first comparative example, i.e., in the case of using the single CVD film (CVD $Al_2O_3$) as the gate insulating film GI, positive charge is generated at a high concentration at the MOS interface, while the charge amount in the insulating film is sufficiently small. Hence, the secondary coefficient on the thickness t of the gate insulating film in Expression (1) is zero, and the dependence shows a straight line (FIG. 4). When positive charge exists at a high concentration at the MOS interface, the threshold voltage is reduced with an increase in thickness of the gate insulating film. At this time, the gradient corresponds to A1, and $$N_{iteff} = A1 \cdot (\varepsilon_0 \cdot \varepsilon_r)/q \quad (8)$$

is obtained from Expression (2) or (7), and $N_{it}$ (MOS interface charge) is represented by $N_{po}+N_{iteff}$ (FIG. 5).

In the second comparative example, i.e., in the case of using the single sputtered film (sputtered $Al_2O_3$) as the gate insulating film GI, $N_{it}$ (MOS interface charge) is substantially zero. Hence, $N_{iteff}=((\varepsilon_0 \cdot \varepsilon_r)/q) \cdot A1 = -N_{po}$ is obtained.

However, since the positive charge $N_{ot}$ is generated in the gate insulating film, the energy band during pinch-off is as shown in FIG. 6. At this time, the dependence of Vt on the thickness of the gate insulating film is convex upward as shown in FIG. 7. Thus, Vt increases with the thickness of the gate insulating film in a region of a thin gate insulating film, or a region of thickness allowing dVt/dt>0 in Expression (2). However, further increasing thickness of the gate insulating film results in dVt/dt<0 in Expression (2) due to the positive charge in the gate insulating film, and Vt begins to be reduced. Hence, when the thickness of the gate insulating film is increased to a thickness necessary for a device, for example, about 50 to 100 nm, Vt becomes negative.

On the other hand, as in the first embodiment, when the stacked film of the CVD film/sputtered film is used as the gate insulating film GI, the sputtered film should be formed within a thickness range satisfying dVt/dt>0 in Expression (2), and the CVD film should be formed on the sputtered film such that the gate insulating film has a desired thickness (for example, about 50 to 100 nm as described before). The CVD process allows the small amount of charge in the film, and thus makes it possible to form the insulating film up to a desired thickness (for example, about 50 to 100 nm as described before) while dVt/dt>0 is maintained in Expression (2). In such a stacked structure of the CVD film/sputtered film, since dVt/dt>0 is given in Expression (2), Vt linearly increases with an increase in the thickness of the gate insulating film (see graph (c) in FIG. 9). In the range of the thickness $t_1$ of the sputtered film, which satisfies dVt/dt>0, i.e., satisfies $dVt/dt=-(q \cdot N_{ot})/(\varepsilon_0 \cdot \varepsilon_r) \cdot t_1 - (q \cdot N_{iteff})/(\varepsilon_0 \cdot \varepsilon_r)>0$, the following relations are given.

$$0 < t_1 < -N_{iteff}/N_{ot}$$

It is assumed that dVt/dt=A1 is given at t=$t_1$. The total thickness of the thickness $t_1$ of the sputtered film and the thickness $t_2$ of the CVD film is denoted by t. Thus, the following expressions are given at t>$t_1$.

$$Vt = -0.5 \cdot (q \cdot N_{ot})/(\varepsilon_0 \cdot \varepsilon_r) \cdot t^2 - (q \cdot N_{iteff})/(\varepsilon_0 \cdot \varepsilon_r) \cdot t + \Phi_B - (\Delta E_C + E_F) + \text{2DEG dissolving layer increment} + \text{barrier layer decrement} \quad (1)$$

$$dVt/dt = (q \cdot N_{ot})/(\varepsilon_0 \cdot \varepsilon_r) \cdot t - (q \cdot N_{iteff})/(\varepsilon_0 \cdot \varepsilon_r) = A1 \quad (2)$$

Hence, Vt is represented by the following expression (see graph (c) in FIG. 9).

$$Vt = A1 \cdot (t - t_1) + \Phi_B - (\Delta E_C + E_F) + \text{2DEG dissolving layer increment} + \text{barrier layer decrement} \quad (9)$$

Second Verification

Subsequently, examples of the threshold voltages of the first and second comparative examples and the first embodiment are now described with the numerical expressions described in the first verification.

In the first comparative example, i.e., in the case of using the single CVD film (CVD Al$_2$O$_3$) as the gate insulating film GI, numerical values are substituted into Expression (1) based on graph (b1) in FIG. 5, and thus the following expressions are obtained.

$$Vt = -3.2E\text{-}2 \cdot t - 0.15 \ (V) \quad (1\text{-}1)$$

$$dVt/dt = -3.2E\text{-}2 \ (V/\text{nm}) \quad (2\text{-}1)$$

$N_{iteff} = 1.6E12 \text{ cm}^{-2}$ is calculated from $$N_{iteff} = ((\varepsilon_0 \cdot \varepsilon_r)/q \cdot A1 \quad (7)$$

A1: the primary coefficient value of t in Expression (1). Since $N_{po}$ (charge generated at the interface between the buffer layer and the channel layer) is $2.6E12 \text{ cm}^{-2}$, positive charge of $+4.2E12 \text{ cm}^{-2}$ is generated at the MOS interface from $qN_{it} = qN_{po} + qN_{iteff}$. The charge in the film is zero.

The threshold voltage of a transistor having a gate insulating film 60 nm thick formed of the single CVD film (CVD Al$_2$O$_3$) is obtained from Expression (1-1) as follows: $Vt = -3.2E\text{-}2 \cdot 60 - 0.15 \ (V) = -1.77 \ V$. That is, the threshold voltage is negative.

In the second comparative example, i.e., in the case of using the single sputtered film (sputtered Al$_2$O$_3$) as the gate insulating film GI, numerical values are substituted into Expression (1) based on graph (b2) in FIG. 7, and thus the following expressions are obtained.

$$Vt = A2 \cdot t^2 + A1 \cdot t = -1.2E\text{-}3 \cdot t^2 + 5.3E\text{-}2 \cdot t \ (V) \quad (1\text{-}2)$$

$$dVt/dt = -2.4E\text{-}3 \cdot t + 5.3E\text{-}2 \ (V/\text{nm}) \quad (2\text{-}2)$$

At this time $N_{iteff} = -2.6E12 \text{ cm}^{-2}$ is calculated from $$N_{iteff} = ((\varepsilon_0 \cdot \varepsilon_r)/q) \cdot A1 \quad (7)$$

A1: the primary coefficient value of t in Expression (1-2). $-N_{po}$ (charge generated at the interface between the buffer layer and the channel layer) is $2.6E12 \text{ cm}^{-2}$. Hence, the MOS interface charge ($N_{it} = N_{po} + N_{iteff}$) is zero.

The charge $N_{ot} + 1.19E18 \text{ cm}^3$ in the film is calculated from $$N_{ot} = 2((\varepsilon_0 \cdot \varepsilon_r)/q) \cdot A2 \quad (5)$$

A2: the secondary coefficient value of t in Expression (1-2).

The threshold voltage of a transistor having a gate insulating film 60 nm thick formed of the single sputtered film (sputtered Al$_2$O$_3$) is obtained from Expression (1-2) as follows:

$$Vt = -1.2E\text{-}3 \cdot 60^2 + 5.3E\text{-}2 \cdot 60 = 0.432 - 3.18 = -2.7 \ (V).$$

That is, the threshold voltage is negative.

On the other hand, as in the first embodiment, when the stacked film of the CVD Al$_2$O$_3$/sputtered Al$_2$O$_3$ is used as the gate insulating film GI, the following electric field is applied to the sputtered Al$_2$O$_3$ having a thickness $t_1$ of 5 nm.

$$dVt/dt = A1 = -2.4E\text{-}3 \cdot 5 + 5.3E\text{-}2 = 4.1E\text{-}2 \ (V/\text{nm}) \quad (2\text{-}3)$$

The CVD Al$_2$O$_3$ on the sputtered Al$_2$O$_3$ is assumed to be 55 nm thick. Since charge in the CVD Al$_2$O$_3$ is zero, the MOS interface charge is maintained and the following expression is obtained.

$$Vt = A1(60-5) = 4.1E\text{-}2 \cdot (60-5) = 2.3 \ (V) \quad (3\text{-}3)$$

Thus, the threshold voltage (Vt) is 2.3 (V), i.e., positive.

As described above, the first and second verifications prove usefulness of the gate insulating film having the stacked structure of the CVD film/sputtered film. The numerical values in the second verification are merely shown as an example, and the first embodiment is not limited to any configuration having such numerical values.

Description of Manufacturing Method

A method of manufacturing the semiconductor device of the first embodiment is now described with reference to FIGS. 10 to 20 while the configuration of the semiconductor device is further clarified. FIGS. 10 to 20 are each a sectional view illustrating a manufacturing process of the semiconductor device of the first embodiment.

Figure 10:
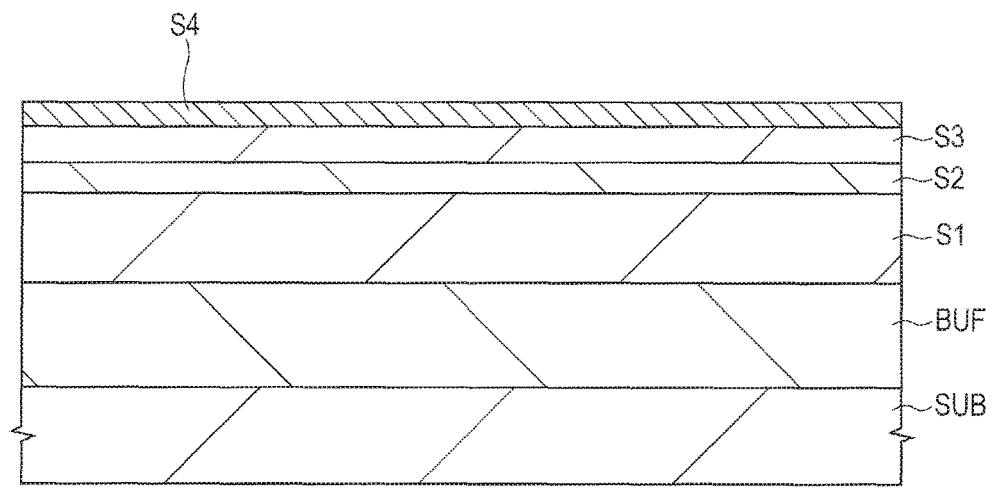
FIG. 10 is a sectional view illustrating a manufacturing process of the semiconductor device of the first embodiment.

As shown in FIG. 10, the undepicted nucleation layer is formed on the substrate SUB, and then the high-resistance buffer layer BUF is formed on the nucleation layer. A semiconductor substrate including, for example, silicon (Si), the (111) plane of which is exposed, is used as the substrate SUB, and, for example, an aluminum nitride (AlN) layer is epitaxially grown on the substrate SUB about 200 nm as the nucleation layer using a metal organic chemical vapor deposition (MOCVD) process or the like.

In addition to such a silicon substrate, a substrate including SiC, sapphire, or the like may also be used as the substrate SUB. A GaN substrate may also be used. In such a case, the nucleation layer may be omitted. The nucleation layer and any nitride semiconductor layer (III-V compound semiconductor layer) subsequent to the nucleation layer are typically formed by group III element plane growth (in this embodiment, gallium plane growth or aluminum plane growth).

Subsequently, a superlattice structure is formed as the high-resistance buffer layer BUF on the nucleation layer by repeatedly stacking a stacked film (AlN/GaN film) of a gallium nitride (GaN) layer and an aluminum nitride (AlN) layer. For example, a gallium nitride (GaN) layer about 20 nm thick and an aluminum nitride (AlN) layer about 5 nm thick are alternately epitaxially grown using a metal organic chemical vapor deposition process or the like. For example, the stacked film is formed by 40 layers. For example, an AlGaN layer is epitaxially grown as part of the high-resistance buffer layer BUF on the superlattice structure using a metal organic chemical vapor deposition process or the like. The AlGaN layer has a thickness of about 1 to 2 μm, for example.

Subsequently, an AlGaN layer is epitaxially grown about 1 μm as the first nitride semiconductor layer (buffer layer) S1 on the high-resistance buffer layer BUF using a metal organic chemical vapor deposition process or the like. With the compositional element ratio of the AlGaN layer, X is 0 to 0.1 (0≤X≤0.1) for Al$_X$Ga$_{1-X}$N, for example. For example, X is 0.05.

Subsequently, an InGaN layer is epitaxially grown about 50 nm as the second nitride semiconductor layer (channel layer) S2 on the first nitride semiconductor layer S1 using a metal organic chemical vapor deposition process or the like. With the compositional element ratio of the InGaN layer, Y1 is 0 to 0.05 (0≤Y1≤0.05) for In$_{Y1}$Ga$_{1-Y1}$N, for example.

Subsequently, an AlGaN layer is epitaxially grown about 20 nm as the third nitride semiconductor layer (barrier layer) S3 on the second nitride semiconductor layer S2 using a metal organic chemical vapor deposition process or the like. With the compositional element ratio of the AlGaN layer, Z is larger than X and smaller than 0.4 (X<Z<0.4) for Al$_Z$Ga$_{1-Z}$N, for example. For example, Z is 0.25.

Subsequently, an InGaN layer is epitaxially grown about 30 nm as the fourth nitride semiconductor layer (2DEG dissolving layer) S4 on the third nitride semiconductor layer S3 using a metal organic chemical vapor deposition process or the like. With the compositional element ratio of the InGaN layer, Y2 is equal to or larger than Y1 and equal to or smaller than 0.05 (Y1≤Y2≤0.05) for $In_{Y2}Ga_{1-Y2}N$, for example.

For example, the first to fourth nitride semiconductor layers S1 to S4 are grown while a carrier gas and source gases are introduced into an apparatus. Gases each containing a compositional element of the nitride semiconductor layer (AlGaN layer or InGaN layer herein) are used as the source gases. For example, trimethylaluminum (TMAl), trimethylgallium (TMG), and ammonia are used as the source gases for Al, Ga, and N, respectively, for formation of the AlGaN layer. For example, trimethylindium (TMI), trimethylgallium (TMG), and ammonia are used as the source gases for In, Ga, and N, respectively, for formation of the InGaN layer. In this way, the epitaxial growth process makes it possible to easily and accurately adjust the compositional element ratio of each layer by adjusting a flow rate of each source gas. In addition, the epitaxial growth process makes it possible to easily and continuously form the layers having different element compositions by switching the source gas.

Figure 11:
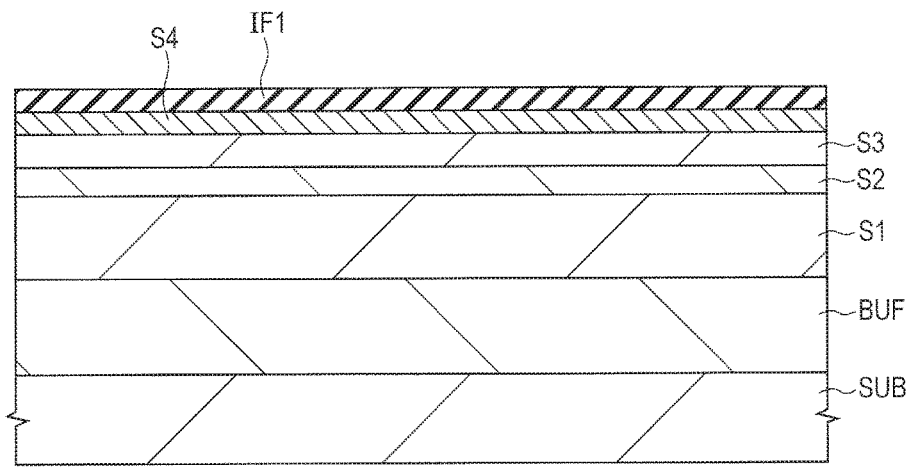
FIG. 11 is a sectional view illustrating the manufacturing process of the semiconductor device of the first embodiment.

Subsequently, as shown in FIG. 11, a silicon oxide film is deposited about 100 nm as the insulating film IF1 on the fourth nitride semiconductor layer S4 using a plasma CVD process or the like.

Figure 12:
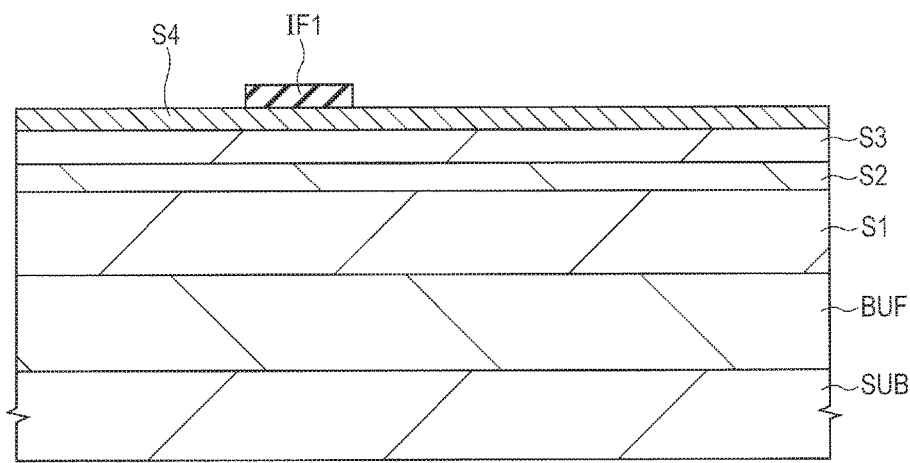
FIG. 12 is a sectional view illustrating the manufacturing process of the semiconductor device of the first embodiment.

Subsequently, as shown in FIG. 12, the insulating film IF1 is processed using photolithography and an etching technique. Specifically, an undepicted photoresist film is formed on the insulating film IF1, and the photoresist film is left only in a formation region of the fourth mesa-type nitride semiconductor layer (2DEG dissolving layer) S4. Subsequently, the insulating film IF1 is etched with the photoresist film as a mask. Subsequently, the photoresist film is removed.

Figure 13:
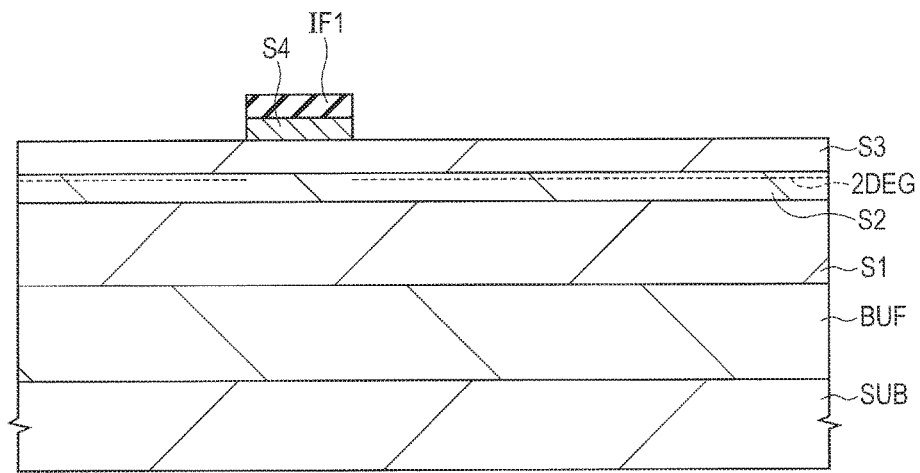
FIG. 13 is a sectional view illustrating the manufacturing process of the semiconductor device of the first embodiment.

Subsequently, as shown in FIG. 13, the fourth nitride semiconductor layer S4 is etched with the insulating film IF1 as a mask. For example, the fourth nitride semiconductor layer S4 is processed by dry etching using a chlorine-based gas. Such etching of an underlayer film with a film having a desired shape as a mask is referred to as patterning. Adding a fluorine-based gas to the chlorine-based gas increases the etching selectivity between the third nitride semiconductor layer S3 and the fourth nitride semiconductor layer S4, leading to improvement in etching controllability. A side surface of the fourth nitride semiconductor layer S4 may be tapered.

Figure 14:
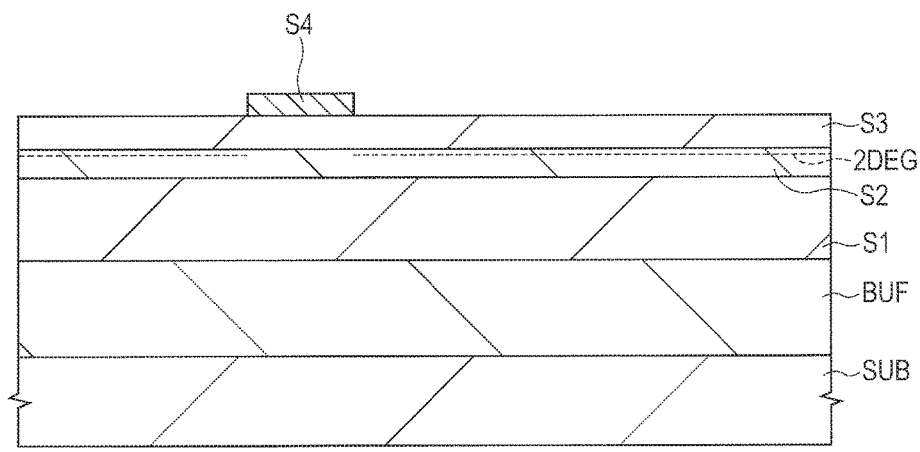
FIG. 14 is a sectional view illustrating the manufacturing process of the semiconductor device of the first embodiment.

Subsequently, as shown in FIG. 14, the insulating film IF1 on the fourth mesa-type nitride semiconductor layer S4 is removed. For example, the insulating film IF1 is removed by dry or wet etching.

Subsequently, the surface protective film PRO is formed over the fourth mesa-type nitride semiconductor layer (2DEG dissolving layer) S4 and the third nitride semiconductor layer (barrier layer) S3. For example, a silicon nitride film is deposited about 100 nm as the surface protective film PRO by a plasma CVD process or the like. In addition to the silicon nitride film (SiN film), a silicon oxide film ($SiO_2$ film), a silicon oxynitride film (SiON film), an aluminum oxide film ($Al_2O_3$ film), and the like may be used as the surface protective film PRO. Such insulating films may be formed by any possible method without limitation, and, for example, the silicon oxide film can be formed by a thermal CVD process. The aluminum oxide film can be formed by an atomic layer deposition (ALD) process, for example.

Figure 15:
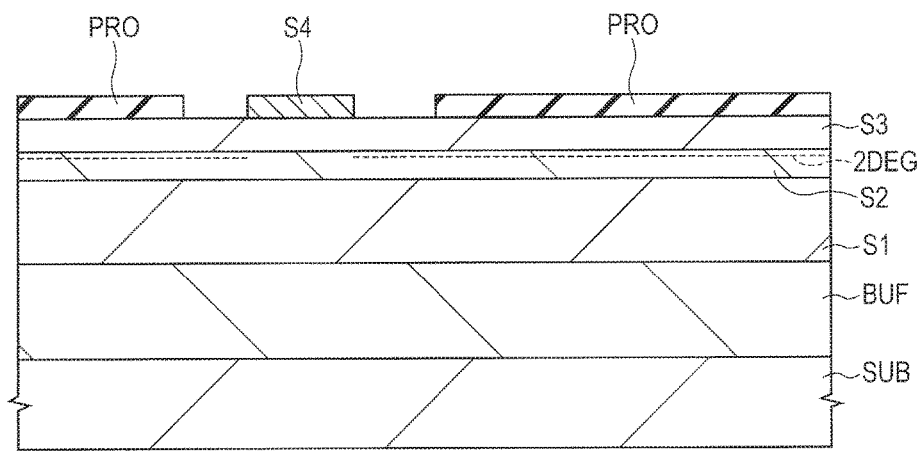
FIG. 15 is a sectional view illustrating the manufacturing process of the semiconductor device of the first embodiment.

Subsequently, the surface protective film PRO on the fourth mesa-type nitride semiconductor layer (2DEG dissolving layer) S4 is removed. For example, the surface protective film PRO over the fourth mesa-type nitride semiconductor layer (2DEG dissolving layer) S4 and over a partial region of the third nitride semiconductor layer (barrier layer) S3 on either side of the fourth nitride semiconductor layer S4 is etched with an undepicted photoresist film having an opening over the fourth mesa-type nitride semiconductor layer (2DEG dissolving layer) S4 (FIG. 15). This exposes the surface of the fourth mesa-type nitride semiconductor layer (2DEG dissolving layer) S4 and part of the third nitride semiconductor layer (barrier layer) S3 on either side of the fourth nitride semiconductor layer S4. In this way, the fourth mesa-type nitride semiconductor layer (2DEG dissolving layer) S4 is disposed separately from the surface protective film PRO on the right (a side close to the drain electrode) in the drawing, and the third nitride semiconductor layer (barrier layer) S3 is exposed from between the nitride semiconductor layer S4 and the surface protective film PRO. The fourth mesa-type nitride semiconductor layer (2DEG dissolving layer) S4 is disposed separately from the surface protective film PRO on the left (a side close to the source electrode) in the drawing, and the third nitride semiconductor layer (barrier layer) S3 is exposed from between the nitride semiconductor layer S4 and the surface protective film PRO. Subsequently, the photoresist film is removed.

Figure 16:
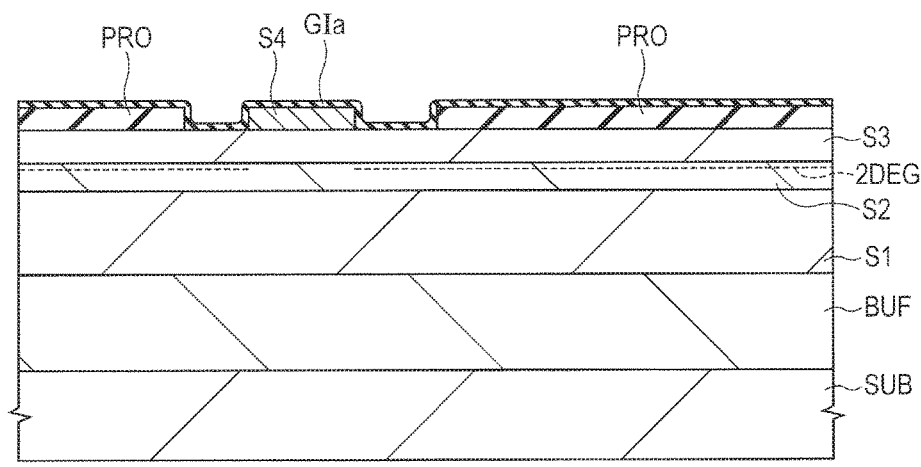
FIG. 16 is a sectional view illustrating the manufacturing process of the semiconductor device of the first embodiment.
Figure 17:
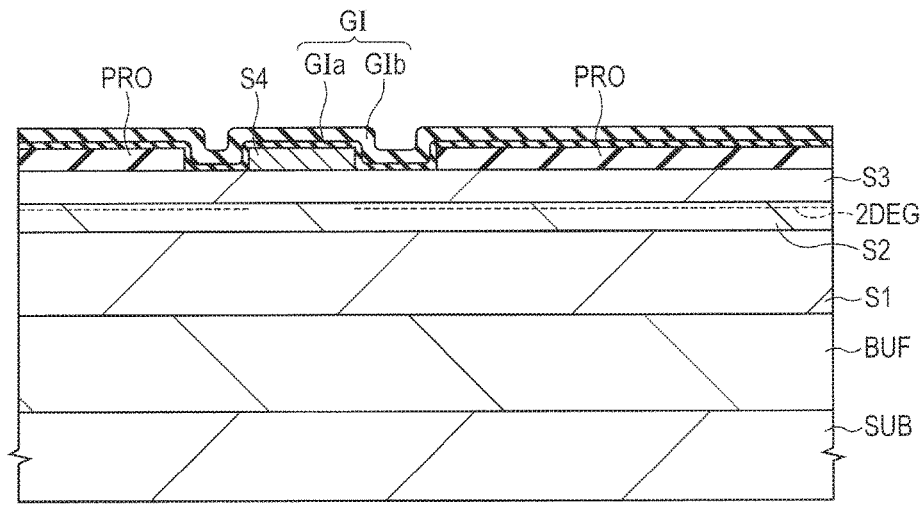
FIG. 17 is a sectional view illustrating the manufacturing process of the semiconductor device of the first embodiment.

Subsequently, as shown in FIGS. 16 and 17, the gate insulating film GI is formed on the fourth mesa-type nitride semiconductor layer (2DEG dissolving layer) S4. For example, a stacked film of the CVD film/sputtered film is formed as the gate insulating film GI over the surface protective film PRO including over the fourth mesa-type nitride semiconductor layer (2DEG dissolving layer) S4 and the exposed portion of the third nitride semiconductor layer (barrier layer) S3 on either side of the fourth nitride semiconductor layer S4.

For example, as shown in FIG. 16, an aluminum oxide film ($Al_2O_3$ film) is deposited about 5 nm thick using a sputtering process. Specifically, the aluminum oxide film ($Al_2O_3$ film) is formed by the sputtering process under a non-oxidizing atmosphere such as an Ar atmosphere using a target of aluminum oxide ($Al_2O_3$).

Subsequently, as shown in FIG. 17, an aluminum oxide film ($Al_2O_3$ film) is deposited about 55 nm thick using a CVD process. For example, the aluminum oxide film ($Al_2O_3$ film) is formed while trimethylaluminum (TMAl) and $O_3$ are Introduced into an apparatus as the source gases. Although the aluminum oxide film is formed using the CVD process herein, the film may be formed using an ALD process. The ALD process is one of CVD processes. In the ALD process, atoms are deposited one layer at a time using the self-limiting characteristic as a property of the atoms. In the ALD process, atomic layers are deposited one layer at a time by repeating a cycle of (1) precursor charge, (2) purging, (3) subsequent precursor charge, and (4) purging. Since the precursor is charged using a chemical vapor, the ALD process is considered as one of the CVD processes.

In the first embodiment, the content of hydrogen (H) or carbon (C) of the CVD film GIb is $1E18/cm^3$ or more, and the content of hydrogen (H) or carbon (C) of the sputtered film GIa is $1E17/cm^3$ or less. The content of hydrogen (H) can be measured by secondary ion mass spectrometry (SIMS).

Although the sputtered film GIa and the CVD film GIb are each the aluminum oxide ($Al_2O_3$) film herein, such films may be either the same film or different films. For example, the combination of the sputtered film GIa and the CVD film GIb may be not only the sputtered $Al_2O_3$ and CVD $Al_2O_3$ but also any of combinations of sputtered $Al_2O_3$ and CVD AlN, sputtered $Al_2O_3$ and CVD $SiO_2$, and sputtered $Al_2O_3$ and CVD SiN.

The combination may also be any of combinations of sputtered AlN and CVD $Al_2O_3$, sputtered AlN and CVD AlN, sputtered AlN and CVD $SiO_2$, and sputtered AlN and CVD SiN.

The combination may also be any of combinations of sputtered $SiO_2$ and CVD $Al_2O_3$, sputtered $SiO_2$ and CVD AlN, sputtered $SiO_2$ and CVD $SiO_2$, and sputtered $SiO_2$ and CVD SiN.

The combination may also be any of combinations of sputtered SiN and CVD $Al_2O_3$, sputtered SiN and CVD AlN, sputtered SiN and CVD $SiO_2$, and sputtered SiN and CVD SiN.

In this way, a sputtered film, which is formed with an insulator itself as a target, is effectively used to prevent oxidation of the surface of the fourth mesa-type nitride semiconductor layer (2DEG dissolving layer) S4.

Figure 18:
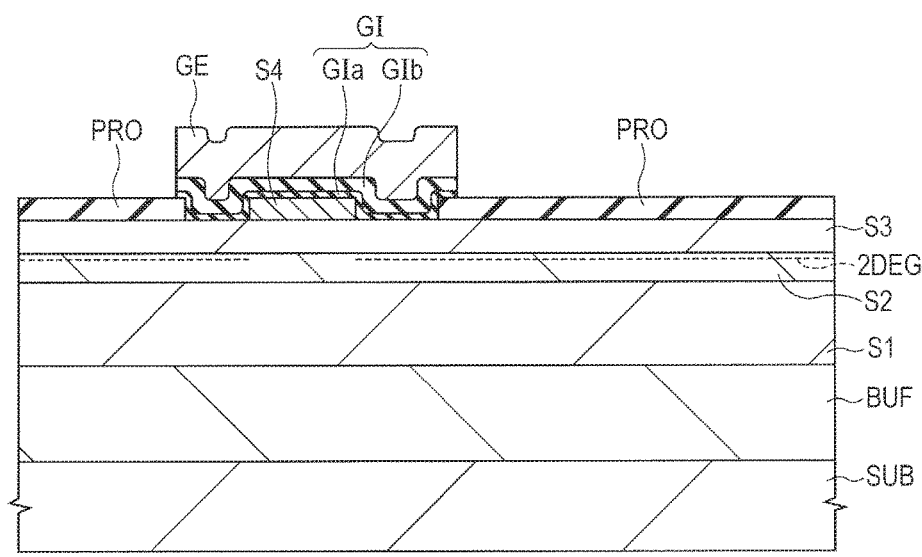
FIG. 18 is a sectional view illustrating the manufacturing process of the semiconductor device of the first embodiment.

Subsequently, as shown in FIG. 18, the gate electrode GE is formed on the gate insulating film GI. For example, a titanium nitride (TiN) film is deposited about 200 nm thick as a conductive film (constituent material of the gate electrode GE) on the gate insulating film GI using a sputtering process or the like. The constituent material or thickness of the gate electrode GE can be appropriately adjusted. In addition to TiN, polycrystalline silicon doped with a dopant such as B or P may be used for the gate electrode GE. Furthermore, Ti, Al, Ni, Pt, and Au may be used, and Si or N compounds of them may a lso be used. A multilayer film formed by stacking such material films may also be used.

Subsequently, an undepicted photoresist film is formed in a gate electrode formation region using a photolithography technique, and the TiN film is etched with the photoresist film as a mask, thereby the gate electrode GE is formed. For example, the TiN film is etched by dry etching using a gas containing $Cl_2$ as a main component. Subsequently, the photoresist film is removed. A fluorine-based gas may be used in place of the chlorine-based gas such as $Cl_2$. A mixed gas of the chlorine-based gas and the fluorine-based gas may be used. Subsequently, the gate insulating film (aluminum oxide film) GI as an underlayer of the gate electrode (TiN film) GE is etched. For example, the aluminum oxide film is etched by dry etching using a gas containing $BCl_3$ as a main component. Subsequently, the photoresist film is removed.

Figure 19:
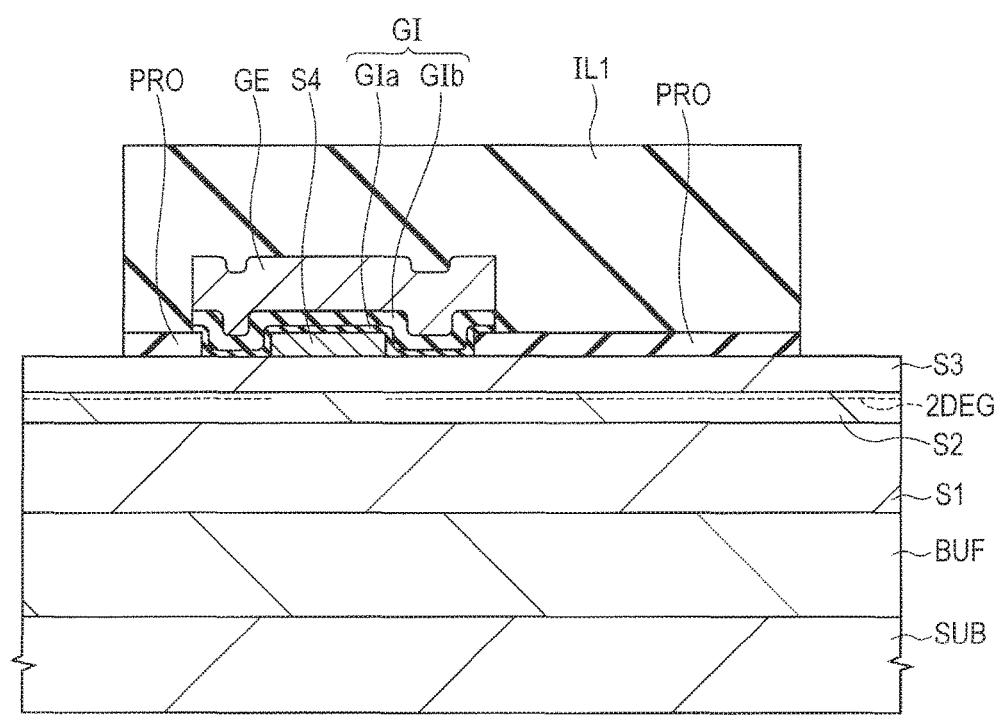
FIG. 19 is a sectional view illustrating the manufacturing process of the semiconductor device of the first embodiment.

Subsequently, as shown in FIG. 19, the interlayer insulating film IL1 is formed over the gate electrode GE and the surface protective film PRO. For example, a silicon oxide film is deposited about 2 μm as the interlayer insulating film IL1 using a CVD process or the like. A so-called TEOS film formed from tetraethyl orthosilicate as a source material may be used as the silicon oxide film. Subsequently, contact holes are formed in the interlayer insulating film IL1 using photolithography and an etching technique. For example, an undepicted photoresist film, having an opening in each of a source electrode coupling region and a drain electrode coupling region, is formed over the interlayer insulating film IL1. Subsequently, the interlayer insulating film IL1 and the surface protective film PRO are etched with the photoresist film as a mask, thereby the contact holes are formed. For example, the interlayer insulating film IL1 is etched by dry etching using a gas (fluorine-based gas) containing $SF_6$ as a main component. This exposes the third nitride semiconductor layer (barrier layer) S3 in each of the source electrode coupling region and the drain electrode coupling region located on the two respective sides of the gate electrode GE.

Figure 20:
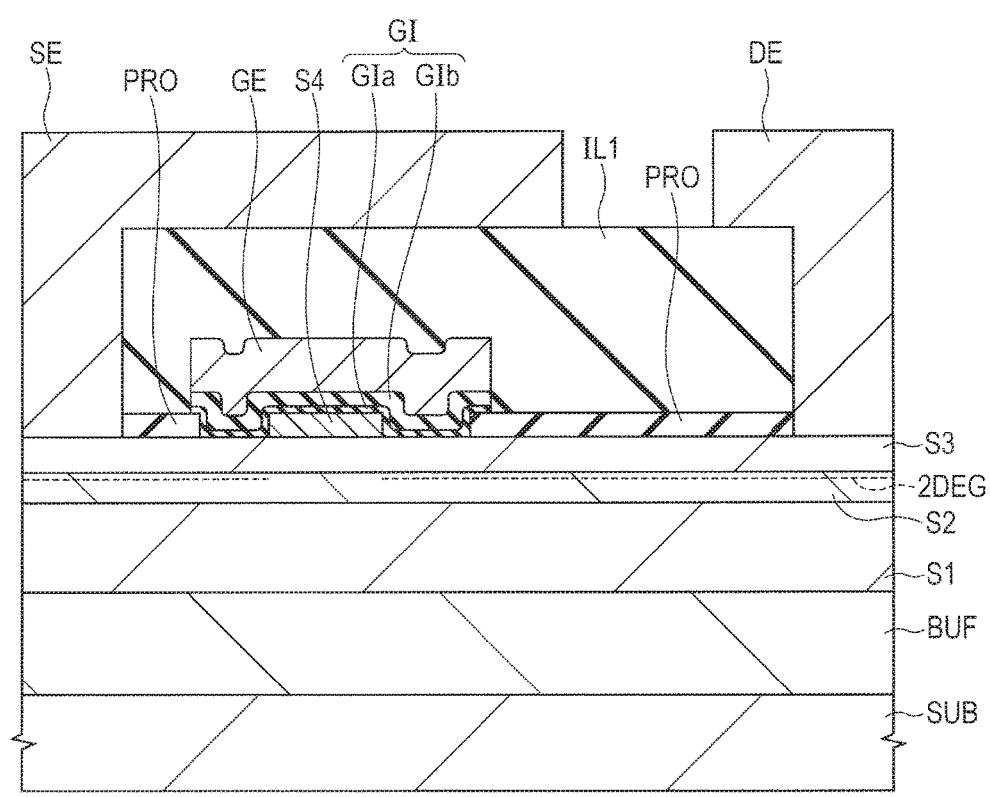
FIG. 20 is a sectional view illustrating the manufacturing process of the semiconductor device of the first embodiment.

Subsequently, as shown in FIG. 20, the source electrode SE and the drain electrode DE are formed in the respective contact holes and over the interlayer insulating film IL1. For example, a conductive film is formed over the interlayer insulating film IL1 including the insides of the contact holes. For example, an Al/Ti film is formed as the conductive film. For example, a Ti film is formed about 20 nm thick using a sputtering process or the like over the interlayer insulating film IL1 including the insides of the contact holes, and an Al film is formed about 2 μm thick on the Ti film using a sputtering process or the like. Subsequently, heat treatment is performed. For example, heat treatment of 500° C. at 30 min is performed. As a result, ohmic contact can be established between the conductive film (Al/Ti film) and the underlying layer. Au (1 μm)/Ti (10 nm) film may be used as the conductive film in place of the Al/Ti film.

Subsequently, an undepicted photoresist film is formed in each of the formation regions of the source electrode SE and the drain electrode DE, and the conductive film (Al/Ti film) is etched with the photoresist film as a mask. For example, the conductive film (Al/Ti film) is etched by dry etching using a gas containing $Cl_2$ as a main component.

The constituent material or thickness of the conductive film configuring the source electrode SE and the drain electrode DE can be appropriately adjusted. A material that will be in ohmic contact with the nitride semiconductor layer is preferably used as such a conductive film.

Subsequently, an insulating film is formed over the interlayer insulating film IL1 including over the source electrode SE and over the drain electrode DE. Furthermore, an overlying interconnection layer may be formed. A protective film including an insulating film may be formed over the uppermost interconnection layer.

Through the above-described steps, the semiconductor device of the first embodiment can be formed. The above-described process is merely shown as an example, and the semiconductor device of the first embodiment may be manufactured by a process other than such a process.

Second Embodiment

Although the first embodiment is exemplarily described with a mesa-type transistor in which a mesa-shaped nitride semiconductor is disposed below the gate electrode with the gate insulating film in between, a recess-gat-type transistor may also be used. A configuration and a manufacturing process similar to those of the first embodiment are not described.

Figure 21:
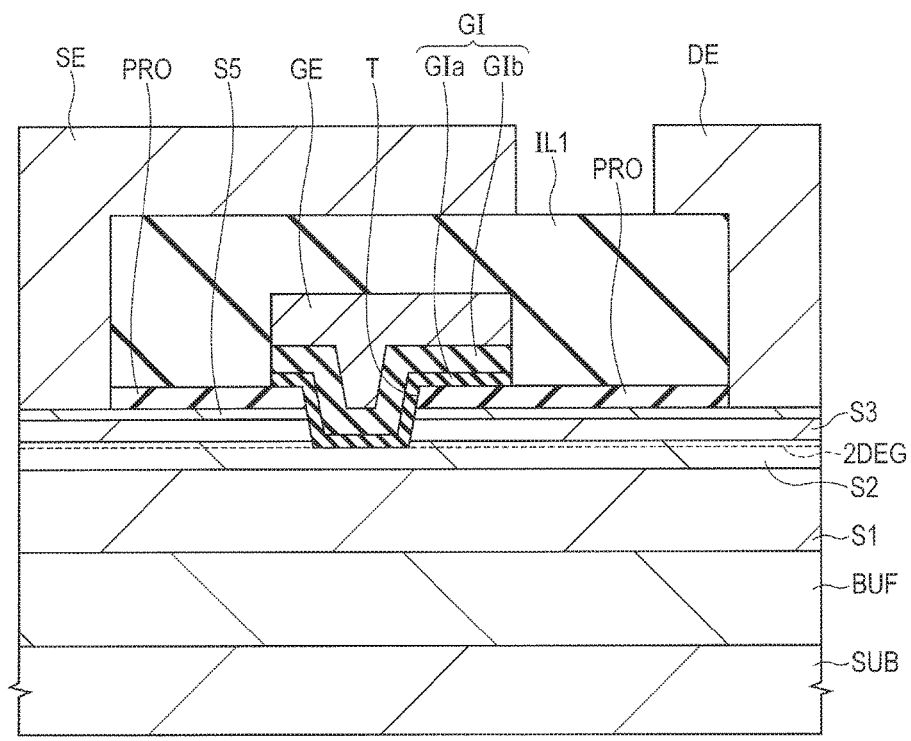
FIG. 21 is a sectional view illustrating a configuration of a semiconductor device of a second embodiment.

A semiconductor device of a second embodiment is now described in detail with reference to the drawings.
Description of Structure FIG. 21 is a sectional view illustrating a configuration of a semiconductor device of the second embodiment. The semiconductor device shown in FIG. 21 is a MOS field effect transistor using a nitride semiconductor, and may also be referred to as high electron mobility transistor (HEMT). The semiconductor device of the second embodiment is what is called a recess-gate-type semiconductor device.

In the semiconductor device of the second embodiment, a high-resistance buffer layer BUF is provided on the substrate SUB. The high-resistance buffer layer BUF may be formed on a nucleation layer that is first formed on the substrate SUB.

The respective materials similar to those in the first embodiment can be used for the substrate SUB, the nucleation layer, and the high-resistance buffer layer BUF. The first to third nitride semiconductor layers S1 to S3 are sequentially formed on the high-resistance buffer layer BUF, and a fifth nitride semiconductor layer S5 is formed on the third nitride semiconductor layer S3. The fifth nitride semiconductor layer S5 may be omitted.

The second nitride semiconductor layer S2 has an electron affinity larger than that of the first nitride semiconductor layer S1 (S1<S2).

The third nitride semiconductor layer S3 has an electron affinity smaller than that of the first nitride semiconductor layer S1 (S1>S3).

The fifth nitride semiconductor layer S5 has an electron affinity larger than that of the first nitride semiconductor layer S1 (S5>S1).

The first nitride semiconductor layer S1 may be referred to as buffer layer (back barrier layer, channel underlayer), and includes, for example, AlGaN. The second nitride semiconductor layer S2 may be referred to as channel layer, and includes, for example, InGaN. The third nitride semiconductor layer S3 may be referred to as barrier layer (electron supply layer), and includes, for example, AlGaN. The fifth nitride semiconductor layer S5 may be referred to as cap layer, and includes, for example, InGaN. The second nitride semiconductor layer (channel layer) S2 and the fifth nitride semiconductor layer (cap layer) S5 may each be formed of GaN.

The semiconductor device of the second embodiment includes the gate electrode GE formed over the second nitride semiconductor layer (channel layer) S2 with the gate insulating film GI in between, and the source electrode SE and the drain electrode DE formed on the fifth nitride semiconductor layer (cap layer) S5 on the two respective sides of the gate electrode GE. The gate electrode GE is formed within a trench (also referred to as recess), which penetrates the fifth and third nitride semiconductor layers (cap layer, barrier layer) S5 and S3 and reaches the middle of the second nitride semiconductor layer (channel layer) S2, with the gate insulating film GI in between.

Two-dimensional electron gas (2DEG) is generated in the second nitride semiconductor layer (channel layer) S2 in the vicinity of the interface between the second nitride semiconductor layer (channel layer) S2 and the third nitride semiconductor layer (barrier layer) S3. The two-dimensional electron gas (2DEG) is divided by the trench T in which the gate electrode GE is provided. Hence, when a predetermined voltage (threshold voltage) is applied to the gate electrode GE; a channel is formed in the vicinity of the interface between the gate insulating film GI and the second nitride semiconductor layer (channel layer) S2, and thus the transistor is turned on.

In the second embodiment, the gate insulating film GI is configured by the sputtered film GIa as a lower layer and the CVD film GIb as an upper layer. The sputtered film GIa is formed within the trench T and on the surface protective film PRO, and the CVD film GIb is formed on the sputtered film GIa.

In this way, in the second embodiment, since the gate insulating film GI is also configured by the CVD film/sputtered film, the positive charge amount is reduced at the MOS interface and in the insulating film, so that the threshold voltage can be increased as described in detail in the first embodiment. Consequently, the normally-off characteristics can be improved.

Verification

Subsequently, the threshold voltages of the first and second comparative examples and the first embodiment are exemplarily calculated using the numerical expressions described in the first verification of the first embodiment. In the second embodiment, the first comparative example corresponds to a case of using a single CVD film (CVD $Al_2O_3$) as the gate insulating film GI, and the second comparative example corresponds to a case of using a single sputtered film (sputtered $Al_2O_3$) as the gate insulating film GI.

In the first comparative example, i.e., in the case of using the single CVD film (CVD $Al_2O_3$) as the gate insulating film GI, numerical values are substituted into Expression (1), and thus the following expressions are obtained.

$$Vt=-1.2E-2 \cdot t-0.44 \ (V) \tag{1-4}$$

$$dVt/dt=-1.2E-2(V/\text{nm}) \tag{2-4}$$

$N_{iteff}=6.2E11 \ cm^{-2}$ is calculated from $$N_{it}=-N_{po}+N_{iteff} \tag{3}$$

Since $N_{po}$ (charge generated at the interface between the buffer layer and the channel layer) is $2.6E12 \ cm^{-2}$, positive charge of $+3.2E12 \ cm^{-2}$ is generated at the MOS interface from $N_{it}=-N_{po}+N_{iteff}$. The charge in the film is zero.

The threshold voltage of a transistor having a gate insulating film 60 nm thick formed of the single CVD film (CVD $Al_2O_3$) is obtained from Expression (1-4) as follows: $Vt=-1.2E-2 \cdot 60-0.44 \ (V)=-0.28 \ V$. That is, the threshold voltage is negative.

In the second comparative example, i.e., in the case of using the single sputtered film (sputtered $Al_2O_3$) as the gate insulating film GI, numerical values are substituted into Expression (1), and the following expressions are obtained.

$$Vt=A2 \cdot t^2+A1 \cdot t=-1.2E-3 \cdot t^2+5.3E-2 \cdot t(V) \tag{1-5}$$

$$dVt/dt=-2.4E-3 \cdot t+5.3E-2 \ (V/\text{nm}) \tag{2-5}$$

At this time, $N_{iteff}=-2.6E12 \ cm^{-2}$ is given. $N_{po}$ (charge generated at an interface between the buffer layer and the channel layer) is $2.6E12 \ cm^{-2}$. Hence, the charge $N_{ot}$ in the film is $+1.19E18 \ cm^3$ from $N_{it}=-N_{po}+N_{iteff}$, and the MOS interface charge ($N_{it}$) of zero.

The threshold voltage of a transistor having a gate insulating film 60 nm thick formed of the single sputtered film (sputtered $Al_2O_3$) is obtained from Expression (1-5) as follows:

$$Vt=-1.2E-3 \cdot 60^2+5.3E-2 \cdot 60=0.432-3.18=-2.7 \ (V).$$

That is, the threshold voltage is negative.

On the other hand, as in the second embodiment, when the stacked film of the CVD $Al_2O_3$/sputtered $Al_2O_3$ is used as the gate insulating film GI, the following electric field is applied to the sputtered $Al_2O_3$ having a thickness $t_1$ of 5 nm.

$$dVt/dt=A1=-2.4E-3 \cdot 5+5.3E-2=4.1E-2 \ (V/\text{nm}) \tag{2-3}$$

The CVD $Al_2O_3$ on the sputtered $Al_2O_3$ is assumed to be 55 nm thick. Since the charge in the CVD $Al_2O_3$ is zero, the MOS interface charge is maintained and the following expression is obtained.

$$Vt=A1(60-5)=4.1E-2 \cdot (60-5)=2.3 \ (V) \tag{3-3}$$

Thus, the threshold voltage (Vt) is 2.3 (V), i.e., positive.

As described above, the above-described verification proves usefulness of the gate insulating film having the stacked structure of the CVD film/sputtered film. The numerical values in the verification are merely shown as an example, and the second embodiment is not limited to any configuration having such numerical values.

Description of Manufacturing Method

A method of manufacturing the semiconductor device of the second embodiment is now described with reference to FIGS. 22 to 30 while the configuration of the semiconductor device is further clarified. FIGS. 22 to 30 are each a sectional view illustrating a manufacturing process of the semiconductor device of the second embodiment.

Figure 22:
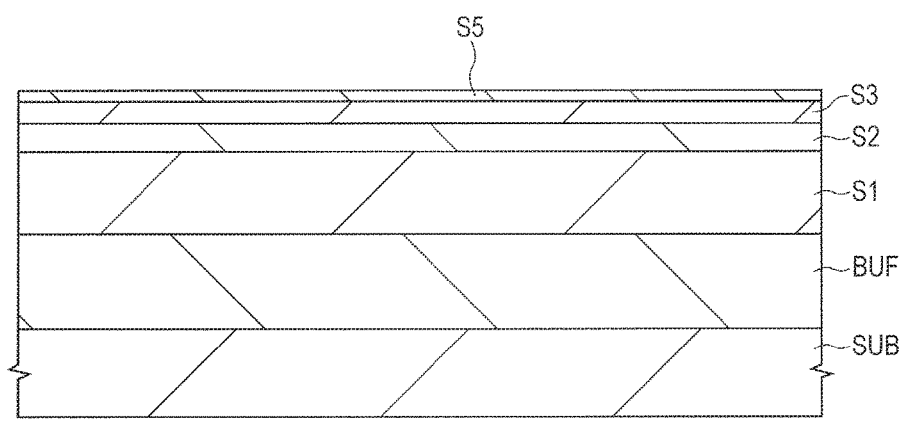
FIG. 22 is a sectional view illustrating a manufacturing process of the semiconductor device of the second embodiment.

As shown in FIG. 22, the undepicted nucleation layer, the high-resistance buffer layer BUF, the first nitride semiconductor layer (buffer layer) S1, the second nitride semiconductor layer (channel layer) S2, and the third nitride semiconductor layer (barrier layer) S3 are sequentially formed on the substrate SUB. The fifth nitride semiconductor layer (cap layer) S5 is formed on the third nitride semiconductor layer (barrier layer) S3.

The substrate SUB, the undepicted nucleation layer, and the high-resistance buffer layer BUF can be formed using materials and steps similar to those in the first embodiment.

Subsequently, an AlGaN layer is epitaxially grown about 1 μm as the first nitride semiconductor layer (buffer layer) S1 on the high-resistance buffer layer BUF using a metal organic chemical vapor deposition process or the like. With the compositional element ratio of the AlGaN layer, X is 0 to 0.1 ($0 \leq X \leq 0.1$) for $Al_xGa_{1-x}N$, for example.

Subsequently, an InGaN layer is epitaxially grown about 50 nm as the second nitride semiconductor layer (channel layer) S2 on the first nitride semiconductor layer S1 using a metal organic chemical vapor deposition process or the like. With the compositional element ratio of the InGaN layer, Y1 is 0 to 0.05 ($0 \leq Y1 \leq 0.05$) for $In_{Y1}Ga_{1-Y1}N$, for example.

Subsequently, an AlGaN layer is epitaxially grown about 20 nm as the third nitride semiconductor layer (barrier layer) S3 on the second nitride semiconductor layer S2 using a metal organic chemical vapor deposition process or the like. With the compositional element ratio of the AlGaN layer, Z is larger than X and smaller than 0.4 ($X<Z<0.4$) for $Al_zGa_{1-z}N$, for example.

Subsequently, an InGaN layer is epitaxially grown about 3 nm as the fifth nitride semiconductor layer (cap layer) S5 on the third nitride semiconductor layer S3 using a metal organic chemical vapor deposition process or the like. With the compositional element ratio of the InGaN layer, Y2 is equal to or smaller than Y1 and is 0 to 0.05 ($Y2 \leq Y1 \leq 0.05$) for $In_{Y2}Ga_{1-Y2}N$, for example.

For example, the first to fifth nitride semiconductor layers S1 to S5 can be grown while source gases are introduced into an apparatus as with the first embodiment.

Figure 23:
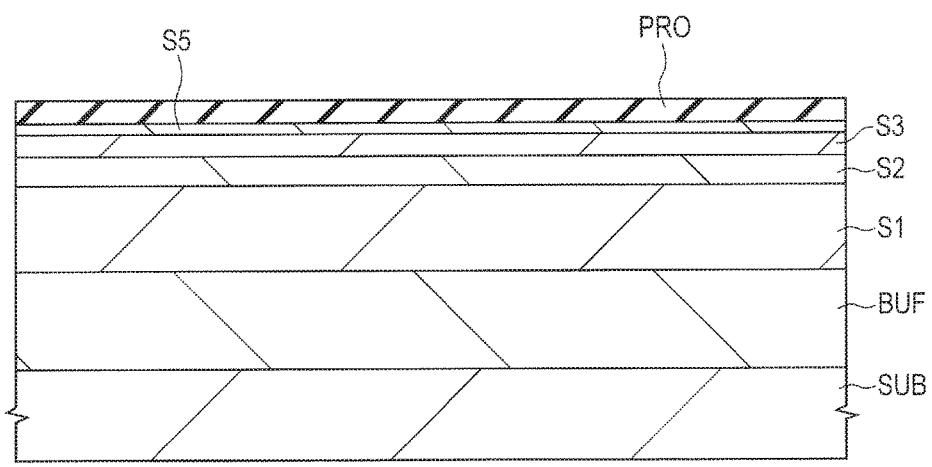
FIG. 23 is a sectional view illustrating the manufacturing process of the semiconductor device of the second embodiment.

Subsequently, as shown in FIG. 23, a silicon nitride film is deposited, for example, about 100 nm thick as the surface protective film PRO including an insulating film by a PECVD process on the fifth nitride semiconductor layer (cap layer) S5.

Figure 24:
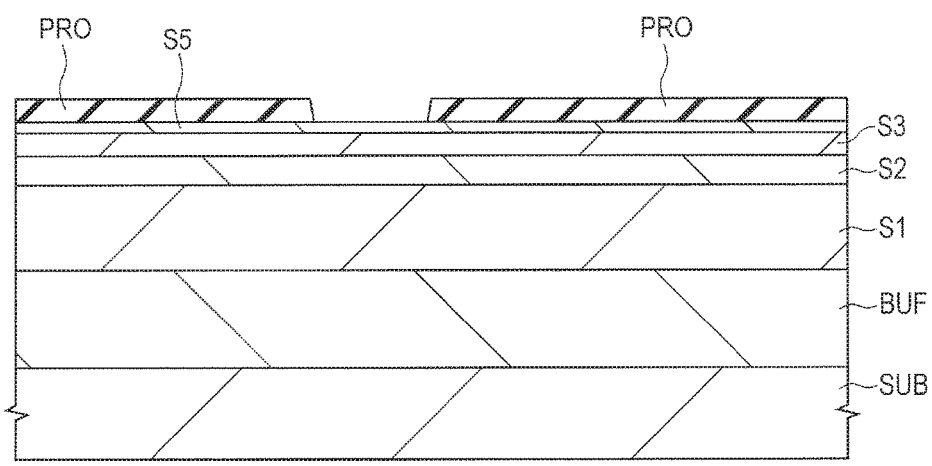
FIG. 24 is a sectional view illustrating the manufacturing process of the semiconductor device of the second embodiment.
Figure 25:
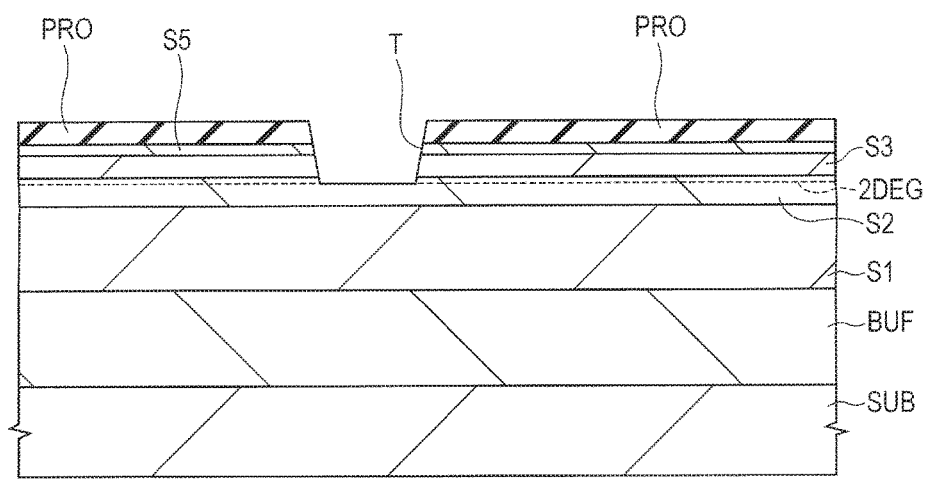
FIG. 25 is a sectional view illustrating the manufacturing process of the semiconductor device of the second embodiment.

Subsequently, as shown in FIGS. 24 and 25, the trench T is formed by photolithography. First, the surface protective film PRO is patterned using a photolithography technique and an etching technique. For example, an undepicted photoresist film having an opening in a formation region of the trench T is formed on the surface protective film PRO. Subsequently, the surface protective film PRO is etched with the photoresist film as a mask (FIG. 24). When a silicon nitride film is used as the surface protective film PRO, dry etching is performed using a fluorine-based gas such as $CF_4$ or $SF_6$, for example. Subsequently, the photoresist film is removed.

Subsequently, as shown in FIG. 25, the surface protective film PRO is used as a mask to dry-etch the fifth nitride semiconductor layer (cap layer) S5, the third nitride semiconductor layer (barrier layer) S3 and the second nitride semiconductor layer (channel layer) S2, thereby the trench T is formed so as to penetrate the fifth and third nitride semiconductor layers (cap layer, barrier layer) S5 and S3 and reach the middle of the second nitride semiconductor layer (channel layer) S2. For example, a chlorine-based gas such as $BCl_3$ is used as the etching gas. Subsequently, the surface of the trench T is subjected to acid treatment (for example, hydrochloric acid treatment).

Figure 26:
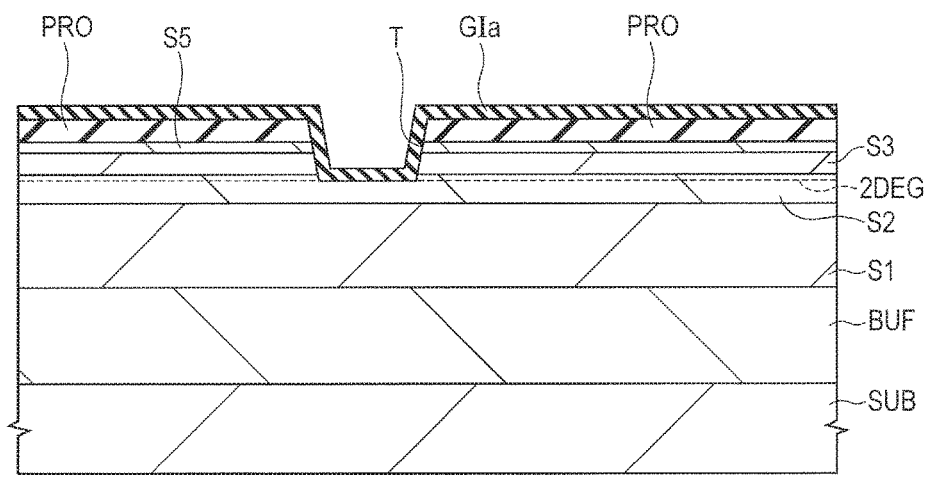
FIG. 26 is a sectional view illustrating the manufacturing process of the semiconductor device of the second embodiment.
Figure 27:
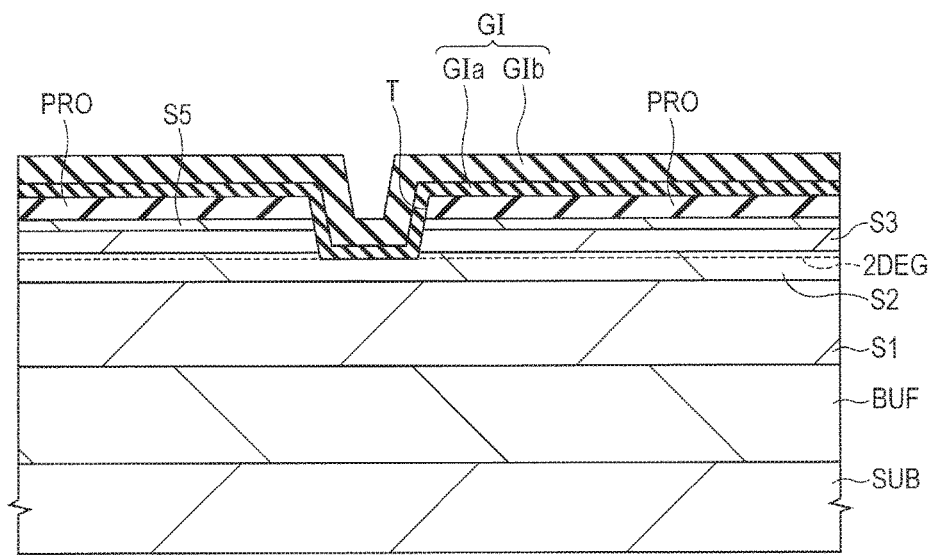
FIG. 27 is a sectional view illustrating the manufacturing process of the semiconductor device of the second embodiment.

Subsequently, as shown in FIGS. 26 and 27, the gate insulating film GI is formed on the surface protective film PRO including the inside of the trench T. For example, a stacked film of the sputtered film GIa and the overlying CVD film GIb is formed on the surface protective film PRO including the inside of the trench T. The gate insulating film GI can be formed using materials and steps similar to those in the first embodiment.

For example, as shown in FIG. 26, an aluminum oxide film ($Al_2O_3$ film) is deposited about 5 nm thick as the sputtered film GIa using a sputtering process, and then, as shown in FIG. 27, an aluminum oxide film ($Al_2O_3$ film) is deposited about 55 nm thick using a CVD process.

Figure 28:
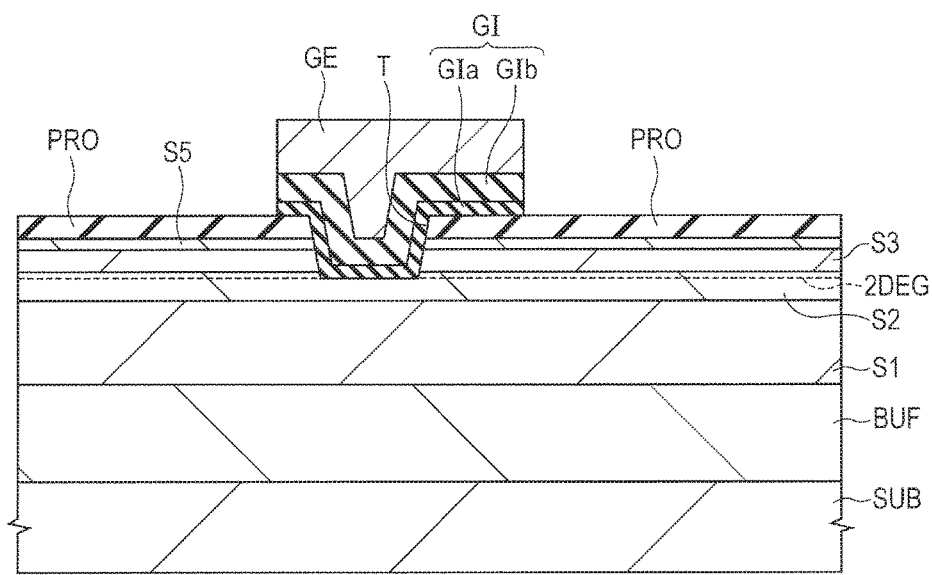
FIG. 28 is a sectional view illustrating the manufacturing process of the semiconductor device of the second embodiment.

Subsequently, as shown in FIG. 28, the gate electrode GE is formed on the gate insulating film GI. For example, a titanium nitride (TiN) film is deposited about 100 nm thick as a conductive film on the gate insulating film GI using a sputtering process. Subsequently, an undepicted photoresist film is formed in a gate electrode formation region using a photolithography technique, and the TiN film is etched with the photoresist film as a mask, thereby the gate electrode GE is formed. For example, dry etching using a chlorine-based gas is performed. The gate insulating film GI exposed on both sides of the gate electrode GE may also be removed during this etching. Subsequently, the photoresist film is removed.

Figure 29:
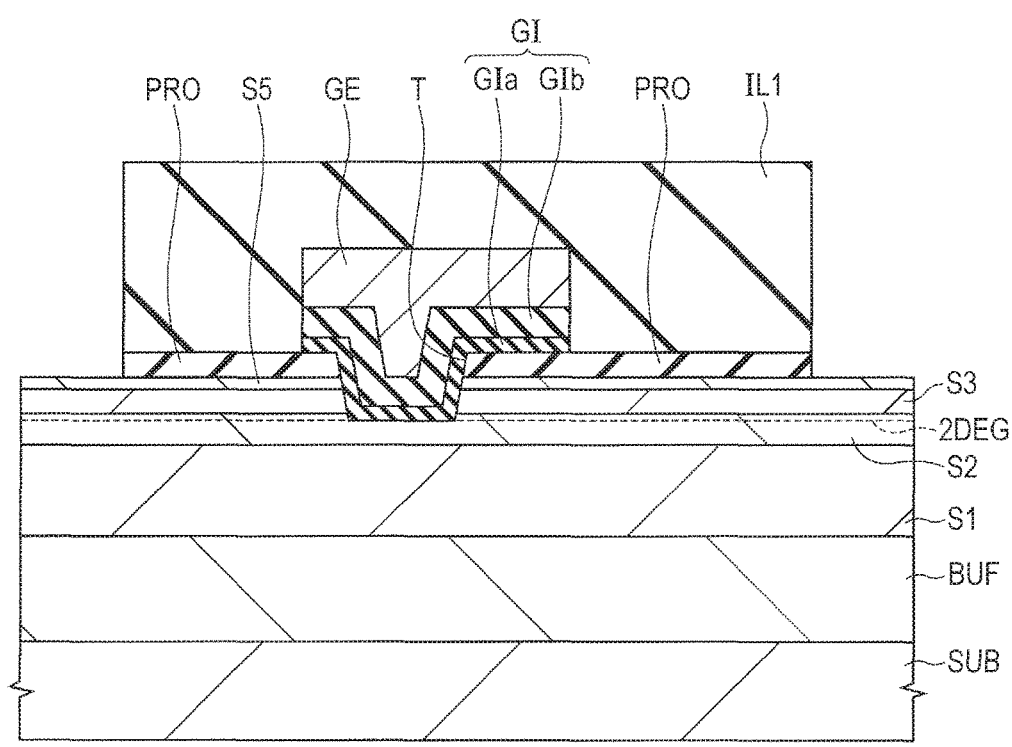
FIG. 29 is a sectional view illustrating the manufacturing process of the semiconductor device of the second embodiment.
Figure 30:
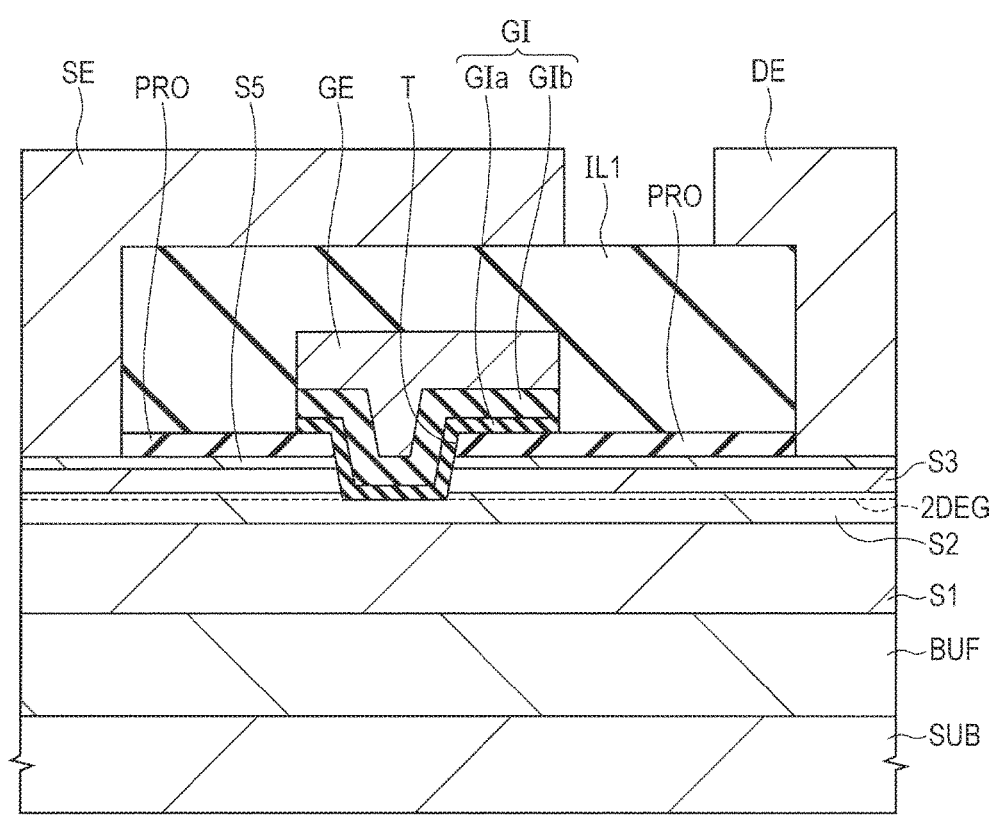
FIG. 30 is a sectional view illustrating the manufacturing process of the semiconductor device of the second embodiment.

Subsequently, as shown in FIGS. 29 and 30, the interlayer insulating film IL1 is formed over the gate electrode GE and the surface protective film PRO, and then contact holes are formed, and then the source electrode SE and the drain electrode DE are formed. The interlayer insulating film IL1, the contact holes, the source electrode SE, and the drain electrode DE can be formed as in the first embodiment.

Subsequently, an insulating film is formed over the interlayer insulating film IL1 including over the source electrode SE and over the drain electrode DE. An overlying interconnection layer may be further formed. A protective film including an insulating film may be formed over the uppermost interconnection layer.

Through the above-described steps, the semiconductor device of the second embodiment can be formed. The above-described process is merely shown as an example, and the semiconductor device of the second embodiment may be manufactured by a process other than such a process.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

Supplementary Note 1

A semiconductor device, including:
a first nitride semiconductor layer;
a second nitride semiconductor layer formed on the first nitride semiconductor layer;
a third nitride semiconductor layer formed on the second nitride semiconductor layer;
a trench that penetrates the second nitride semiconductor layer and reaches the middle of the first nitride semiconductor layer;
a gate electrode formed in the trench with a first insulating film in between; and a first electrode and a second electrode formed on the third nitride semiconductor layer on the two respective sides of the gate electrode, where the second nitride semiconductor layer has an electron affinity equal to or larger than electron affinity of the first nitride semiconductor layer, the third nitride semiconductor layer has an electron affinity smaller than the electron affinity of the first nitride semiconductor layer, the gate insulating film includes a first film formed in the trench and a second film formed on the first film, and the first film includes a sputtered film, and the second film includes a CVD film.

Supplementary Note 2

The semiconductor device according to supplementary note 1, in which the first film includes one of $Al_2O_3$, $SiO_2$, SiN, and AlN.

Supplementary Note 3

The semiconductor device according to supplementary note 2, in which the second film includes one of $Al_2O_3$, $SiO_2$, SiN, and AlN.

Supplementary Note 4

The semiconductor device according to supplementary note 3, in which the second film has a hydrogen (H) content of $1\times10^{18}/cm^3$ or more.

Supplementary Note 5

The semiconductor device according to supplementary note 4, in which the first film has a hydrogen (H) content of $1\times10^{17}/cm^3$ or less.

Supplementary Note 6

The semiconductor device according to supplementary note 5, in which the first film has a thickness of 10 nm or less.

What is claimed is:

1. A method of manufacturing a semiconductor device, the method comprising the steps of:
    (a) forming a second nitride semiconductor layer on a first nitride semiconductor layer;
    (b) forming a third nitride semiconductor layer on the second nitride semiconductor layer;
    (c) forming a fourth mesa-type nitride semiconductor layer on the third nitride semiconductor layer;
    (d) forming a gate insulating film on the fourth mesa-type nitride semiconductor layer; and
    (e) forming a gate electrode on the gate insulating film;
    wherein the second nitride semiconductor layer has an electron affinity equal to or larger than electron affinity of the first nitride semiconductor layer,
    wherein the third nitride semiconductor layer has an electron affinity smaller than the electron affinity of the first nitride semiconductor layer,
    wherein the fourth nitride semiconductor layer has an electron affinity equal to or smaller than the electron affinity of the second nitride semiconductor layer, and
    wherein the step (d) includes the steps of:
    (d1) forming a first film including a first insulator on the fourth mesa-type nitride semiconductor layer by a sputtering process using a target including the first insulator; and
    (d2) forming a second film including a second insulator on the first film by a CVD process.

2. The method according to claim 1, wherein in the step (d1), the first film is formed in a non-oxidizing atmosphere.

3. The method according to claim 2, wherein the first film includes one of $Al_2O_3$, $SiO_2$, SiN, and AlN.

4. The method according to claim 3, wherein the second film includes one of $Al_2O_3$, $SiO_2$, SiN, and AlN.

5. The method according to claim 4, wherein the second film has a hydrogen (H) content of $1\times10^{18}/cm^3$ or more.

6. The method according to claim 5, wherein the first film has a hydrogen (H) content of $1\times10^{17}/cm^3$ or less.

7. The method according to claim 6, wherein the first film has a thickness of 10 nm or less.

8. A method of manufacturing a semiconductor device, the method comprising the steps of:
    (a) forming a second nitride semiconductor layer on a first nitride semiconductor layer;
    (b) forming a third nitride semiconductor layer on the second nitride semiconductor layer;
    (c) forming a trench that penetrates the third nitride semiconductor layer and reaches the middle of the second nitride semiconductor layer;
    (d) forming a gate insulating film within the trench; and
    (e) forming a gate electrode on the gate insulating film;
    wherein the second nitride semiconductor layer has an electron affinity equal to or larger than electron affinity of the first nitride semiconductor layer,
    wherein the third nitride semiconductor layer has an electron affinity smaller than the electron affinity of the first nitride semiconductor layer, and
    wherein the step (d) includes the steps of:
    (d1) forming a first film including a first insulator within the trench by a sputtering process using a target including the first insulator; and
    (d2) forming a second film including a second insulator on the first film by a CVD process.

9. The method according to claim 8, wherein in the step (d1), the first film is formed in a non-oxidizing atmosphere.

10. The method according to claim 9, wherein the first film includes one of $Al_2O_3$, $SiO_2$, SiN, and AlN.

11. The method according to claim 10, wherein the second film includes one of $Al_2O_3$, $SiO_2$, SiN, and AlN.

12. The method according to claim 11, wherein the second film has a hydrogen (H) content of $1\times10^{18}/cm^3$ or more.

13. The method according to claim 12, wherein the first film has a hydrogen (H) content of $1\times10^{17}/cm^3$ or less.

14. The method according to claim 13, wherein the first film has a thickness of 10 nm or less.

* * * * *